(12) United States Patent
Oka et al.

(10) Patent No.: US 9,123,635 B2
(45) Date of Patent: Sep. 1, 2015

(54) MANUFACTURING METHOD OF SEMICONDUCTOR DEVICE

(71) Applicant: TOYODA GOSEI CO., LTD., Kiyosu-shi (JP)

(72) Inventors: Toru Oka, Kiyosu (JP); Nariaki Tanaka, Kiyosu (JP)

(73) Assignee: TOYODA GOSEI CO., LTD., Kiyosu-Shi, Aichi-Ken (JP)

(*) Notice: Subject to any disclaimer, the term of this patent is extended or adjusted under 35 U.S.C. 154(b) by 1 day.

(21) Appl. No.: 14/105,018

(22) Filed: Dec. 12, 2013

(65) Prior Publication Data

US 2014/0167062 A1  Jun. 19, 2014

(30) Foreign Application Priority Data

Dec. 14, 2012  (JP) ................. 2012-272987

(51) Int. Cl.
| | |
|---|---|
| H01L 21/28 | (2006.01) |
| H01L 31/072 | (2012.01) |
| H01L 29/20 | (2006.01) |
| H01L 21/285 | (2006.01) |
| H01L 29/45 | (2006.01) |

(52) U.S. Cl.
CPC ...... H01L 29/2003 (2013.01); H01L 21/28587 (2013.01); H01L 29/452 (2013.01)

(58) Field of Classification Search
CPC ............. H01L 21/28587; H01L 29/2003; H01L 29/452
USPC ............. 438/602, 604–606; 257/189–195
See application file for complete search history.

(56) References Cited

U.S. PATENT DOCUMENTS

| | | | |
|---|---|---|---|
| 7,211,839 B2 | 5/2007 | Kachi et al. | |
| 7,884,395 B2 | 2/2011 | Saito | |
| 8,044,434 B2 | 10/2011 | Ohta et al. | |
| 2004/0157355 A1 | 8/2004 | Kachi et al. | |
| 2009/0008679 A1 | 1/2009 | Saito | |
| 2009/0098676 A1* | 4/2009 | Soejima et al. | 438/46 |
| 2010/0006894 A1 | 1/2010 | Ohta et al. | |
| 2012/0181548 A1 | 7/2012 | Okada et al. | |

FOREIGN PATENT DOCUMENTS

| | | |
|---|---|---|
| JP | 07-045867 A | 2/1995 |
| JP | 09-064337 A | 3/1997 |
| JP | 2000-12846 A | 1/2000 |
| JP | 2004-260140 A | 9/2004 |
| JP | 2008-53449 A | 3/2008 |
| JP | 2008-205175 A | 9/2008 |
| JP | 2009-9993 A | 1/2009 |
| JP | 2009-212529 A | 9/2009 |
| JP | 2010-109086 A | 5/2010 |
| JP | 2011-82397 A | 4/2011 |

* cited by examiner

Primary Examiner — H Tsai
(74) Attorney, Agent, or Firm — McGinn IP Law Group, PLLC

(57) ABSTRACT

A manufacturing method of a semiconductor device includes the steps of: forming a first electrode layer on a n-type semiconductor layer; forming a second electrode layer on a p-type semiconductor layer; and performing heat treatment for the first electrode layer and the second electrode layer formed on the semiconductor layers. Temperature of the heat treatment is not lower than 400 degrees centigrade and not higher than 650 degrees centigrade.

28 Claims, 12 Drawing Sheets

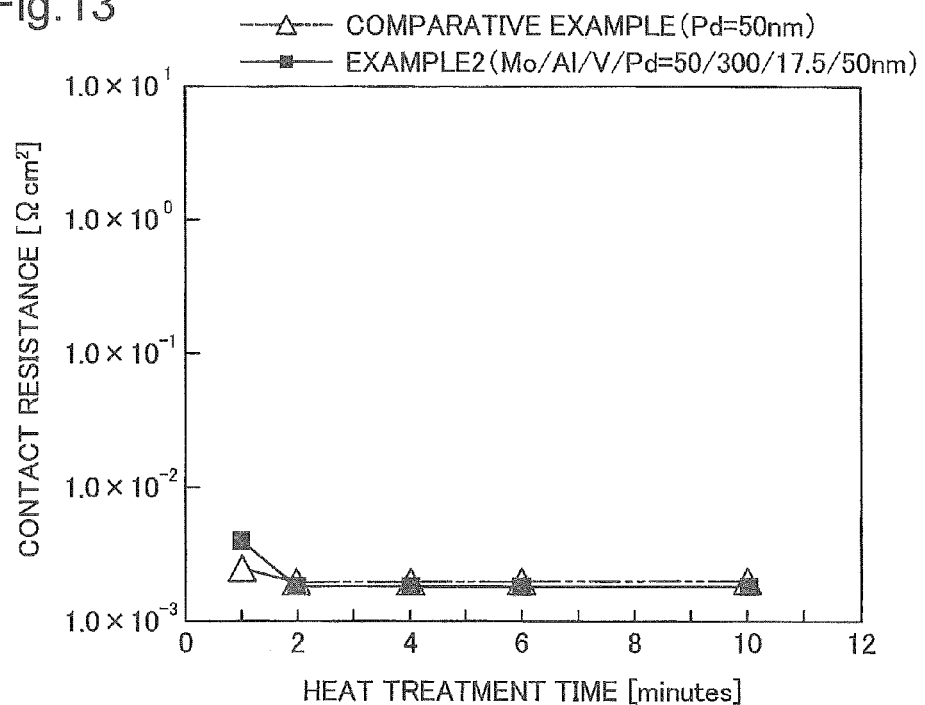
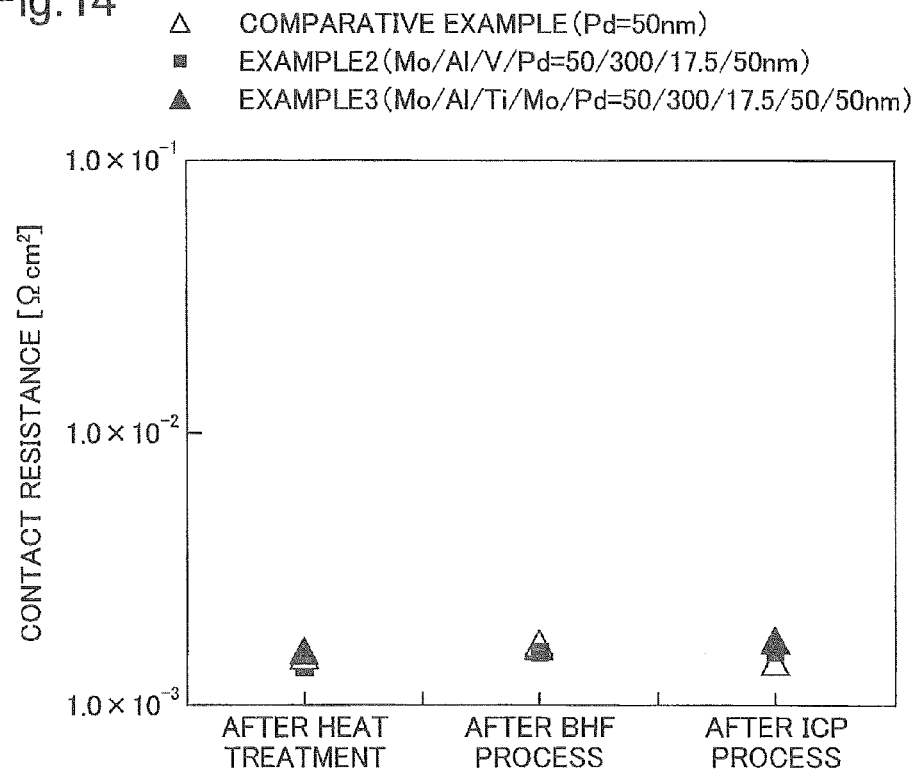

MANUFACTURING METHOD OF SEMICONDUCTOR DEVICE

CROSS REFERENCE TO RELATED APPLICATIONS

The present application claims the priority based on Japanese Patent Application No. 2012-272987 filed on Dec. 14, 2012, the disclosure of which is hereby incorporated by reference in its entirety.

BACKGROUND OF THE INVENTION

1. Technical Field

The present invention relates to a manufacturing method of a semiconductor device.

2. Description of the Related Art

A known configuration of a semiconductor device has a p-type semiconductor layer and an n-type semiconductor layer connected with the p-type semiconductor layer. An electrode layer formed on the semiconductor layer of this semiconductor device is required to suppress the contact resistance, while ensuring the adhesiveness to the semiconductor layer. In order to meet this requirement, one proposed technique employs an electrode of a layered structure where an aluminum (Al) layer is formed on a titanium (Ti) layer as the electrode layer formed on the n-type semiconductor layer mainly made of gallium nitride (GaN) (see, for example, JP H07-45867A). Another proposed technique employs an electrode of a layered structure where a gold (Au) layer is formed on a nickel (Ni) layer as the electrode layer formed on the p-type semiconductor layer mainly made of gallium nitride (see, for example, JP H09-64337A).

SUMMARY OF THE INVENTION

In the case of forming an electrode (first electrode layer) on the n-type semiconductor layer of the semiconductor device and forming an electrode layer (second electrode layer) on the p-type semiconductor layer, the above prior techniques require that the first electrode layer and the second electrode layer are formed to be isolated from each other according to the overlay accuracy of photolithography for formation of the first electrode layer and the second electrode layer. This requirement limits miniaturization of the semiconductor device. Additionally, the above prior techniques still have room for further improvement in achieving the good ohmic contact between each semiconductor layer and each electrode layer. Furthermore, with respect to the prior manufacturing methods of the semiconductor device, it is desired to facilitate production and save resources.

In order to solve at least part of the problems described above, the invention provides aspects and embodiments described below.

(1) In one aspect of the present invention, there is provided a manufacturing method of a semiconductor device. The semiconductor device includes: a p-type semiconductor layer mainly made of gallium nitride (GaN); an n-type semiconductor layer mainly made of gallium nitride (GaN) and connected with the p-type semiconductor layer; a first electrode layer formed on the n-type semiconductor layer; and a second electrode layer formed on the p-type semiconductor layer. The first electrode layer and the second electrode layer are electrically connected such as to each operate at an identical potential. The first electrode layer is connected with at least a part of a surface of the second electrode layer which is opposite to a surface of the second electrode layer that is in contact with the p-type semiconductor layer. The manufacturing method comprises the steps of: forming the first electrode layer on the n-type semiconductor layer; forming the second electrode layer on the p-type semiconductor layer; and performing heat treatment for the first electrode layer and the second electrode layer formed on the semiconductor layers. Temperature of the heat treatment is not lower than 400 degrees centigrade and not higher than 650 degrees centigrade. The manufacturing method of the semiconductor device according to this aspect enables production of a small-size semiconductor device having a miniaturized electrode peripheral part by stacking the first electrode layer on the second electrode layer and thereby reduces the manufacturing cost of the semiconductor device. Additionally, in the manufacturing method of the semiconductor device of this aspect, the temperature of heat treatment performed for the first electrode layer and the second electrode layer formed on the semiconductor layers is not lower than 400 degrees centigrade and not higher than 650 degrees centigrade. This condition ensures the good ohmic contact between each semiconductor layer and each electrode layer.

(2) In other aspect of the present invention, there is provided a manufacturing method of a semiconductor device. The semiconductor device includes: a p-type semiconductor layer mainly made of gallium nitride (GaN); an n-type semiconductor layer mainly made of gallium nitride (GaN) and connected with the p-type semiconductor layer; a first electrode layer formed on the n-type semiconductor layer; and a second electrode layer formed on the p-type semiconductor layer. The first electrode layer and the second electrode layer are electrically connected such as to each operate at an identical potential. The second electrode layer is connected with at least a part of a surface of the first electrode layer which is opposite to a surface of the first electrode layer that is in contact with the n-type semiconductor layer. The manufacturing method comprises the steps of: forming the first electrode layer on the n-type semiconductor layer; forming the second electrode layer on the p-type semiconductor layer; and performing heat treatment for the first electrode layer and the second electrode layer formed on the semiconductor layers. The manufacturing method of the semiconductor device according to this aspect enables production of a small-size semiconductor device having a miniaturized electrode peripheral part by stacking the second electrode layer on the first electrode layer and thereby reduces the manufacturing cost of the semiconductor device.

(3) In the manufacturing method of the semiconductor device according to above described aspects, temperature of the heat treatment may be not lower than 450 degrees centigrade and not higher than 700 degrees centigrade. The manufacturing method of the semiconductor device according to this aspect ensures the good ohmic contact between each semiconductor layer and each electrode layer.

(4) In the manufacturing method of the semiconductor device according to above described aspects, the step of performing the heat treatment may perform the heat treatment simultaneously for the first electrode layer and the second electrode layer. The manufacturing method of the semiconductor device according to this aspect ensures the good ohmic contact between each semiconductor layer and each electrode layer with respect to both the first electrode layer and the second electrode layer by single heat treatment.

(5) In the manufacturing method of the semiconductor device according to above described aspects, the step of performing the heat treatment may comprise the steps of: performing first heat treatment for the first electrode layer; and performing second heat treatment for the second electrode layer. The manufacturing method of the semiconductor device according to this aspect enables optimization of the heat treatment conditions with respect to each of the first electrode layer and the second electrode layer, thus ensuring the better ohmic contact between the semiconductor layer and the electrode layer.

(6) In the manufacturing method of the semiconductor device according to above described aspects, duration time of the heat treatment may be not less than 1 minute and not greater than 1 hour. The manufacturing method of the semiconductor device according to this aspect ensures the better ohmic contact between each semiconductor layer and each electrode layer.

(7) In the manufacturing method of the semiconductor device according to above described aspects, the second electrode layer may include a p contact formation layer arranged on a side to be connected with the p-type semiconductor layer, and the p contact formation layer may contain at least one metal selected from the group consisting of nickel (Ni), palladium (Pd) and platinum (Pt) or an alloy of the selected metal. The manufacturing method of the semiconductor device according to this aspect ensures the substantially ohmic contact between the second electrode layer and the p-type semiconductor layer.

(8) In the manufacturing method of the semiconductor device according to above described aspects, the p contact formation layer may have a layer thickness of not less than 3 nm and not greater than 1000 nm. The manufacturing method of the semiconductor device according to this aspect ensures the better ohmic contact between the second electrode layer and the p-type semiconductor layer. This configuration also avoids potential problems caused by the excessive layer thickness of the second electrode layer; for example, the occurrence of a failure such as disconnection of the first electrode layer formed on the second electrode layer and the increased material cost.

(9) In the manufacturing method of the semiconductor device according to above described aspects, the second electrode layer may include a p barrier layer arranged on a side of the p contact formation layer that is opposite to a side of the p contact formation layer connected with the p-type semiconductor layer, and the p barrier layer may contain at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal. The manufacturing method of the semiconductor device according to this aspect inhibits the reaction of the second electrode layer with the first electrode layer.

(10) In the manufacturing method of the semiconductor device according to above described aspects, the p barrier layer may have a layer thickness of not less than 3 nm and not greater than 1000 nm. The manufacturing method of the semiconductor device according to this aspect more effectively inhibits the reaction of the second electrode layer with the first electrode layer. This configuration also avoids potential problems caused by the excessive layer thickness of the second electrode layer; for example, the occurrence of a failure such as disconnection of the first electrode layer formed on the second electrode layer and the increased material cost.

(11) In the manufacturing method of the semiconductor device according to above described aspects, the first electrode layer may include a first n contact formation layer arranged on a side connected with the n-type semiconductor layer, and a second n contact formation layer arranged on a side of the first n contact formation layer that is opposite to the side of the first n contact formation layer connected with the n-type semiconductor layer, and the first n contact layer may contain at least one metal selected from the group consisting of hafnium (Hf), titanium (Ti) and vanadium (V) or an alloy of the selected metal. The manufacturing method of the semiconductor device according to this aspect ensures the substantially ohmic contact between the first electrode layer and the n-type semiconductor layer.

(12) In the manufacturing method of the semiconductor device according to above described aspects, the first n contact formation layer may have a layer thickness of not less than 3 nm and not greater than 100 nm. The manufacturing method of the semiconductor device according to this aspect ensures the better ohmic contact between the first electrode layer and the n-type semiconductor layer, while avoiding potential problems caused by the excessive layer thickness of the first n contact formation layer: for example, the complicated formation process and the increased material cost.

(13) In the manufacturing method of the semiconductor device according to above described aspects, the second n contact formation layer may contain aluminum (Al) or an aluminum (Al) alloy. The manufacturing method of the semiconductor device according to this aspect ensures the further better ohmic contact between the first electrode layer and the n-type semiconductor layer.

(14) In the manufacturing method of the semiconductor device according to above described aspects, the second n contact formation layer has a layer thickness of not less than 100 nm and not greater than 100 µm. The manufacturing method of the semiconductor device according to this aspect ensures the better ohmic contact between the first electrode layer and the n-type semiconductor layer, while avoiding potential problems caused by the excessive layer thickness of the second n contact formation layer: for example, the complicated formation process and the increased material cost.

(15) In the manufacturing method of the semiconductor device according to above described aspects, the first electrode layer may include an n cap layer arranged on a side of the second n contact formation layer that is opposite to the side of the second n contact formation layer connected with the first n contact formation layer, and the n cap layer may contain at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal. In the manufacturing method of the semiconductor device according to this aspect, the first electrode layer includes the n cap layer having etch resistance. In the case of formation of a contact hole after formation of an inter-layer insulator film on the first electrode, a material without etch resistance is thus employable as the material for the first n contact formation layer or as the material for the second n contact formation layer. This configuration enhances the flexibility in selection of the material for the first n contact formation layer and the material for the second n contact formation layer.

(16) In the manufacturing method of the semiconductor device according to above described aspects, the n cap layer may have a layer thickness of not less than 3 nm and not greater than 100 µm. The manufacturing method of the semiconductor device according to this aspect further enhances the etch resistance of the n cap layer, while avoiding potential problems caused by the excessive layer thickness of the n cap layer: for example, the complicated formation process and the increased material cost.

(17) In the manufacturing method of the semiconductor device according to above described aspects, the first electrode layer may include a first n contact formation layer arranged on a side connected with the n-type semiconductor layer, and the p barrier layer and the first n contact formation layer may be made of an identical material. The manufacturing method of the semiconductor device according to this aspect enables the first n contact formation layer to simultaneously serve as the p barrier layer. This simplifies the process and reduces the material cost.

(18) In the manufacturing method of the semiconductor device according to above described aspects, the first electrode layer may include a first n contact formation layer arranged on a side connected with the n-type semiconductor layer, and a second n contact formation layer arranged on a side of the first n contact formation layer that is opposite to the side of the first n contact formation layer connected with the n-type semiconductor layer, and the first n contact layer may contain at least one metal selected from the group consisting of hafnium (Hf), titanium (Ti) and vanadium (V) or an alloy of the selected metal. The manufacturing method of the semiconductor device according to this aspect ensures the substantially ohmic contact between the first electrode layer and the n-type semiconductor layer.

(19) In the manufacturing method of the semiconductor device according to above described aspects, the first n contact formation layer may have a layer thickness of not less than 3 nm and not greater than 100 nm. The manufacturing method of the semiconductor device according to this aspect ensures the better ohmic contact between the first electrode layer and the n-type semiconductor layer, while avoiding potential problems caused by the excessive layer thickness of the first n contact formation layer: for example, the complicated formation process and the increased material cost.

(20) In the manufacturing method of the semiconductor device according to above described aspects, the second n contact formation layer may contain aluminum (Al) or an aluminum (Al) alloy. The manufacturing method of the semiconductor device according to this aspect ensures the further better ohmic contact between the first electrode layer and the n-type semiconductor layer.

(21) In the manufacturing method of the semiconductor device according to above described aspects, the second n contact formation layer may have a layer thickness of not less than 100 nm and not greater than 1000 nm. The manufacturing method of the semiconductor device according to this aspect ensures the better ohmic contact between the first electrode layer and the n-type semiconductor layer, while avoiding potential problems caused by the excessive layer thickness of the first electrode layer: for example, the occurrence of a failure such as disconnection of the second electrode layer formed on the first electrode layer and the increased material cost.

(22) In the manufacturing method of the semiconductor device according to above described aspects, the first electrode layer formed on the n-type semiconductor layer may include an n barrier layer arranged on a side of the second n contact formation layer that is opposite to the side of the second n contact formation layer connected with the first n contact formation layer, and the n barrier layer may contain at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal. The manufacturing method of the semiconductor device according to this aspect inhibits the reaction of the first electrode layer with the second electrode layer.

(23) In the manufacturing method of the semiconductor device according to above described aspects, the n barrier layer may have a layer thickness of not less than 3 nm and not greater than 1000 nm. The manufacturing method of the semiconductor device according to this aspect more effectively inhibits the reaction of the first electrode layer with the second electrode layer, while avoiding potential problems caused by the excessive layer thickness of the first electrode layer: for example, the occurrence of a failure such as disconnection of the second electrode layer formed on the first electrode layer and the increased material cost.

(24) In the manufacturing method of the semiconductor device according to above described aspects, the second electrode layer may include a p contact formation layer arranged on a side to be connected with the p-type semiconductor layer, and the p contact formation layer may contain at least one metal selected from the group consisting of nickel (Ni), palladium (Pd) and platinum (Pt) or an alloy of the selected metal. The manufacturing method of the semiconductor device according to this aspect ensures the substantially ohmic contact between the second electrode layer and the p-type semiconductor layer.

(25) In the manufacturing method of the semiconductor device according to above described aspects, the p contact formation layer may have a layer thickness of not less than 3 nm and not greater than 100 μm. The manufacturing method of the semiconductor device according to this aspect ensures the better ohmic contact between the second electrode layer and the p-type semiconductor layer, while avoiding potential problems caused by the excessive layer thickness of the p contact formation layer: for example, the complicated formation process and the increased material cost.

(26) In the manufacturing method of the semiconductor device according to above described aspects, the second electrode layer may include a p cap layer arranged on a side of the p contact formation layer that is opposite to a side of the p contact formation layer connected with the p-type semiconductor layer, and the p cap layer may contain at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal. In the manufacturing method of the semiconductor device according to this aspect, the second electrode layer has the p cap layer having etch resistance. When the contact hole is formed after formation of the inter-layer insulator film on the second electrode layer, this configuration enables a material without etch resistance to be employed as the material of the p contact formation layer and thereby improves the flexibility in selection of the material for the p contact formation layer.

(27) In the manufacturing method of the semiconductor device according to above described aspects, the p cap layer may have a layer thickness of not less than 3 nm and not greater than 100 μm. The manufacturing method of the semiconductor device according to this aspect further enhances the etch resistance of the p cap layer, while avoiding potential problems caused by the excessive layer thickness of the p cap layer: for example, the complicated formation process and the increased material cost.

(28) In the manufacturing method of the semiconductor device according to above described aspects, the second electrode layer formed on the p-type semiconductor layer may include a p contact formation layer arranged on a side to be connected with the p-type semiconductor layer, and the n barrier layer and the p contact formation layer may be formed by a single process. The manufacturing method of the semiconductor device according to this aspect enables the p contact formation layer to simultaneously serve as the n barrier layer. This simplifies the process and reduces the material cost.

All the plurality of components included in each of the aspects of the invention described above are not essential. In order to solve part or all of the problems described above or in order to achieve part or all of the advantageous effects described in the specification hereof, part of the plurality of components may be arbitrarily changed, eliminated or replaced with other new components, and part of the limitations may be eliminated. In order to solve part or all of the problems described above or in order to achieve part or all of the advantageous effects described in the specification hereof, part or all of the technical features included in each aspect of the invention described above may be combined with part or all of the technical features included in another aspect of the invention described above to be implemented as another independent aspect of the invention.

The invention may be implemented by any of various aspects other than a manufacturing method of a semiconductor device: for example, a semiconductor device and a power converter including a semiconductor device.

The manufacturing method of the semiconductor device of this invention enables production of a small-size semiconductor device having a miniaturized electrode peripheral part by stacking the first electrode layer on the second electrode layer and thereby reduces the manufacturing cost of the semiconductor device. Additionally, in the manufacturing method of the semiconductor device of this invention, the temperature of heat treatment performed for the first electrode layer and the second electrode layer formed on the semiconductor layers is not lower than 400 degrees centigrade and not higher than 650 degrees centigrade. This condition ensures the good ohmic contact between each semiconductor layer and each electrode layer.

BRIEF DESCRIPTION OF THE DRAWINGS

FIG. 13 is a diagram showing an example of the experimental result for evaluating performance of the semiconductor device according to the second embodiment and its modification; and FIG. 14 is a diagram showing an example of the experimental result for evaluating performance of the semiconductor device according to the second embodiment and its modification.

DESCRIPTION OF EMBODIMENTS

A. First Embodiment

A-1. Configuration of Semiconductor Device

Figure 1:
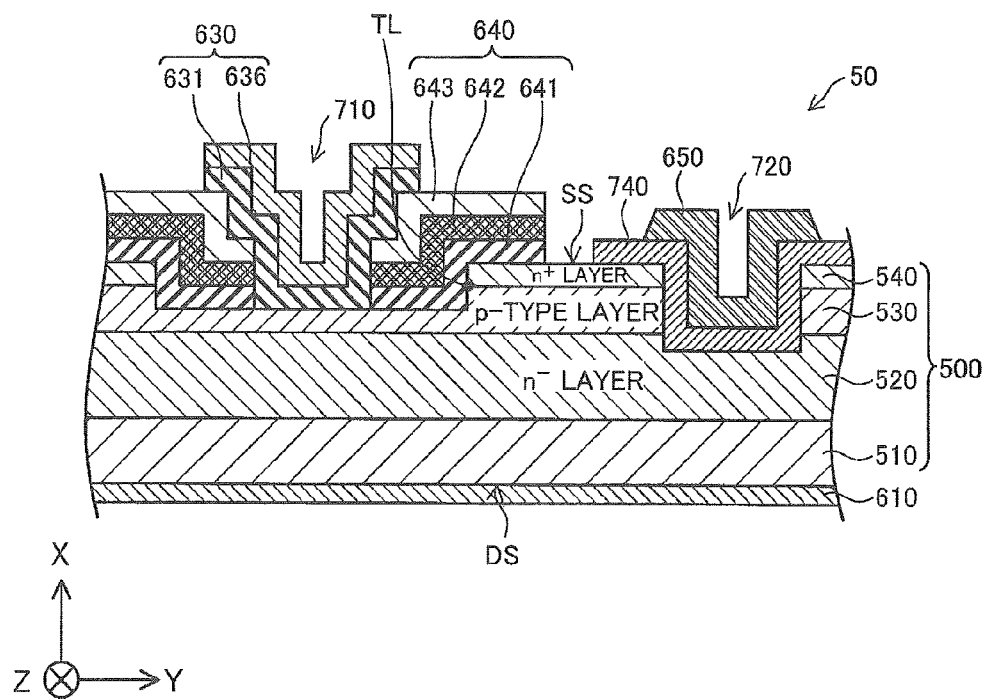
FIG. 1 is a cross sectional view schematically illustrating the configuration of a semiconductor device 50 according to a first embodiment.

FIG. 1 is a cross sectional view schematically illustrating the configuration of a semiconductor device 50 according to a first embodiment. A part of the cross section of the semiconductor device 50 according to this embodiment is illustrated in FIG. 1. FIG. 1 is a diagram that illustrates the technical features of the semiconductor device 50 in an easily comprehensible manner and does not intend to precisely specify the dimensions of the respective parts. In order to facilitate description, X, Y and Z axes orthogonal to one another are shown in FIG. 1. The same applies to the subsequent drawings.

The semiconductor device 50 according to the first embodiment is a trench MOSFET and has a layered structure of an n-type substrate 510, a first n-type semiconductor layer 520, a p-type semiconductor layer 530 and a second n-type semiconductor layer 540 stacked in this sequence. Hereinafter the first n-type semiconductor layer 520 is also called "n− (n minus) layer 520;" the p-type semiconductor layer 530 is also called "p-type layer 530;" and the second n-type semiconductor layer 540 is also called "n+(n plus) layer 540." The direction in which the respective layers are stacked (X-axis direction) is also called the "stacking direction." A layered structure 500 of the n-type substrate 510, the n− layer 520, the p-type layer 530 and the n+ layer 540 has surfaces: the surface defined by the n-type substrate 510 (surface on a −X axis direction side) is also called "drain-side surface DS" and the surface on the opposite side to the drain-side surface DS (surface on a +X axis direction side) is also called "source-side surface SS."

The n-type substrate 510 is in a substantially plate-like shape that is approximately orthogonal to the stacking direction and is mainly made of gallium nitride (GaN). The n− layer 520 is arranged on the surface of one side (+X axis direction side) of the n-type substrate 510. The n− layer 520 is mainly made of gallium nitride (GaN).

The p-type layer 530 is a layer formed by crystal growth and is arranged on the surface of one side (+X axis direction side) of the n− layer 520.

The n+ layer 540 is a layer formed by crystal growth and is arranged on the surface of one side (+X axis direction side) of the p-type layer 530.

A drain electrode layer 610 is provided in the drain-side surface DS of the n-type substrate 510. The drain electrode layer 610 has a layered structure of an aluminum (Al) layer stacked on a titanium (Ti) layer (wherein the titanium layer is arranged on the n-type substrate 510 side).

A trench 720 and a recess 710 are formed on the source-side surface SS of the layered structure 500. The trench 720 is a concavity extended from the source-side surface SS into the n− layer 520. Accordingly, the inner surface of the trench 720 is defined by the n− layer 520, the p-type layer 530 and the n+ layer 540. The recess 710 is a concavity extended from the source-side surface SS into the p-type layer 530. Accordingly, the inner surface of the recess 710 is defined by the p-type layer 530 and the n+ layer 540. The cross sectional shapes of the trench 720 and the recess 710 may be set arbitrarily: for example, a rectangular shape having side faces that are parallel to the stacking direction as shown in FIG. 1; a trapezoidal shape or a wedge shape having side faces that are not parallel to the stacking direction; a partially circular shape or a partially elliptical shape; or a rectangular shape, a trapezoidal shape or a wedge shape having curved corners. The bottom face shapes of the trench 720 and the recess 710 may be set arbitrarily: for example, a rectangular shape, a polygonal shape, a circular shape or an elliptical shape.

A p electrode layer 630 is provided on a portion of the inner surface of the recess 710 defined by the p-type layer 530. The p electrode layer 630 corresponds to the second electrode layer of the claims. The p electrode layer 630 has a two-layer structure of a p contact formation layer 631 that is in contact with the p-type layer 530 and a p cap layer 636 that is formed on the p contact formation layer 631. The p contact formation layer 631 is made of palladium (Pd), and the p cap layer 636 is made of molybdenum (Mo). The layer thickness of the p contact formation layer 631 is preferably not less than 3 nm and not greater than 100 nm. Controlling the layer thickness of the p contact formation layer 631 to this range maintains the substantially ohmic contact between the p electrode layer 630 and the p-type layer 530, while avoiding potential problems caused by the excessive layer thickness of the p contact formation layer 631: for example, the complicated formation process and the increased material cost. The layer thickness of the p contact formation layer 631 is more preferably not less than 5 nm and not greater than 50 µm. Controlling the layer thickness of the p contact formation layer 631 to this range maintains the better ohmic contact between the p electrode layer 630 and the p-type layer 530, while further restricting the layer thickness of the p contact formation layer 631 and more effectively avoiding the above problems. The layer thickness of the p contact formation layer 631 is furthermore preferably not less than 5 nm and not greater than 10 µm. Controlling the layer thickness of the p contact formation layer 631 to this range maintains the better ohmic contact between the p electrode layer 630 and the p-type layer 530, while further restricting the layer thickness of the p contact formation layer 631 and more effectively avoiding the above problems. The layer thickness of the p cap layer 636 is preferably not less than 3 nm and not greater than 100 µm. Controlling the layer thickness of the p cap layer 636 to this range ensures the sufficient etch resistance of the p cap layer 636 and thereby enables a material without etch resistance to be employed as the material of the p contact formation layer 631 when a contact hole is formed after formation of an inter-layer insulator film on the p electrode layer 630. This enhances the flexibility in selection of the material for the p contact formation layer 631, while avoiding potential problems caused by the excessive layer thickness of the p cap layer 636: for example, the complicated formation process and the increased material cost. The layer thickness of the p cap layer 636 is more preferably not less than 5 nm and not greater than 50 µm. Controlling the layer thickness of the p cap layer 636 to this range further enhances the etch resistance of the p cap layer 636, while further restricting the layer thickness of the p cap layer 636 and more effectively avoiding the above problems. The layer thickness of the p cap layer 636 is furthermore preferably not less than 5 nm and not greater than 10 µm. Controlling the layer thickness of the p cap layer 636 to this range furthermore restricts the layer thickness of the p cap layer 636 and furthermore effectively avoids the above problems.

A source electrode layer 640 is provided on the source-side surface SS of the n+ layer 540. The source electrode layer 640 corresponds to the first electrode layer of the claims. The source electrode layer 640 has a three-layer structure of a first n contact formation layer 641 that is in contact with the n+ layer 540, a second n contact formation layer 642 that is formed on the first n contact formation layer 641 and an n barrier layer 643 that is formed on the second n contact formation layer 642. The first n contact formation layer 641 is made of titanium (Ti), the second n contact formation layer 642 is made of aluminum (Al) and the n barrier layer 643 is made of vanadium (V). The layer thickness of the first n contact formation layer 641 is preferably not less than 3 nm and not greater than 100 nm. Controlling the layer thickness of the first n contact formation layer 641 to this range maintains the substantially ohmic contact between the source electrode layer 640 and the n+ layer 540, while preventing the excessive layer thickness of the source electrode layer 640. The excessive layer thickness of the source electrode layer 640 is undesired since it may cause problems: for example, the occurrence of a failure such as disconnection of the p electrode layer 630 formed on the source electrode layer 640; a difficulty in embedding the p electrode layer 630 when the source electrode layer 640 and the p electrode layer 630 are to be embedded in the miniaturized recess 710; and the increased material cost. The layer thickness of the first n contact formation layer 641 is more preferably not less than 5 nm and not greater than 50 nm. Controlling the layer thickness of the first n contact formation layer 641 to this range maintains the better ohmic contact between the source electrode layer 640 and the n+ layer 540, while further restricting the layer thickness of the source electrode layer 640 and more effectively avoiding the above problems. The layer thickness of the second n contact formation layer 642 is preferably not less than 100 nm and not greater than 1000 nm. Controlling the layer thickness of the second n contact formation layer 642 maintains the better ohmic contact between the source electrode layer 640 and the n+ layer 540, while avoiding potential problems caused by the excessive layer thickness of the second n contact formation layer 642: for example, the complicated formation process and the increased material cost. The layer thickness of the second n contact formation layer 642 is more preferably not less than 200 nm and not greater than 500 nm. Controlling the layer thickness of the second n contact formation layer 642 maintains the further better ohmic contact between the source electrode layer 640 and the n+ layer 540, while further restricting the layer thickness of the second n contact formation layer 642 and more effectively avoiding the above problems. The layer thickness of the n barrier layer 643 is preferably not less than 3 nm and not greater than 1000 nm. Controlling the layer thickness of the n barrier layer 643 to this range inhibits the reaction of the source electrode layer 640 with the p electrode layer 630, while preventing the excessive layer thickness of the source electrode layer 640. The layer thickness of the n barrier layer 643 is more preferably not less than 5 nm and not greater than 500 nm. Controlling the layer thickness of the n barrier layer 643 to this range more effectively inhibits the reaction of the source electrode layer 640 with the p electrode layer 630, while further restricting the layer thickness of the source electrode layer 640 and more effectively avoiding the above problems. The detailed structures of the p electrode layer 630 and the source electrode layer 640 will be described later.

The p contact formation layer 631 may be formed by containing at least one metal selected from the group consisting of nickel (Ni), palladium (Pd) and platinum (Pt) or an alloy of the selected metal. This ensures the substantially ohmic contact between the p electrode layer 630 and the p-type layer 530. The p cap layer 636 may be formed by containing at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal. In this application, the p electrode layer 630 includes the p cap layer 636 having the etch resistance. This enables a material without etch resistance to be employed as the material of the p contact formation layer 631 when a contact hole is formed after formation of an inter-layer insulator film on the p electrode layer 630. This accordingly enhances the flexibility in selection of the material for the p contact formation layer 631.

The first n contact formation layer 641 may be formed by containing at least one metal selected from the group consisting of hafnium (Hf), titanium (Ti) and vanadium (V) or an alloy of the selected metal. This ensures the substantially ohmic contact between the source electrode layer 640 and the n+ layer 540. The second n contact formation layer 642 may be formed by containing aluminum (Al) or an aluminum (Al) alloy. This ensures the good ohmic contact between the source electrode layer 640 and the n+ layer 540. The n barrier layer 643 may be formed by containing at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal. This inhibits the reaction of the p electrode layer 630 with the source electrode layer 640.

The number of layers constituting the p electrode layer 630 or the source electrode layer 640 may be set arbitrarily. For example, the p electrode layer 630 may be in a single-layer structure of the p contact formation layer 631. The source electrode layer 640 may be in a single-layer structure of the first n contact formation layer 641 or in a two-layer structure of the first n contact formation layer 641 and the second n contact formation layer 642.

A gate insulator film 740 is formed on the inner surface of the trench 720. The gate insulator film 740 is made of silicon dioxide (SiO$_2$). The gate insulator film 740 is provided to continuously cover the entire inner surface of the trench 720 and a part of the source-side surface SS of the n+ layer 540 adjacent to the trench 720. A gate electrode layer 650 is provided on the surface of the gate insulator film 740 on the opposite side to the surface of the gate insulator film 740 that is in contact with the semiconductor layers. The gate electrode layer 650 is made of aluminum (Al). The gate electrode layer 650 is an electrode layer serving to control the electric current in the semiconductor device 50 and is thereby also called control electrode layer.

In the semiconductor device 50 of this configuration, in the state that no voltage is applied to the gate electrode layer 650, the presence of the p-type layer 530 causes the source electrode layer 640 and the drain electrode layer 610 to have no electrical continuity. When a specific or higher voltage is applied to the gate electrode layer 650, on the other hand, an inversion layer is formed in a portion of the p-type layer 530 in the vicinity of the interface between the p-type layer 530 and the gate insulator film 740. This inversion layer serves as a channel, so that the source electrode layer 640 and the drain electrode layer 610 have electrical continuity via the n+ layer 540, the inversion layer formed in the p-type layer 530, the n− layer 520 and the n-type substrate 510.

The following describes the configuration of the p electrode layer 630 and the source electrode layer 640 in more detail. As described above, the source electrode layer 640 is formed on the source-side surface SS of the n+ layer 540 in such a shape as to be extended from the source-side surface SS of the n+ layer 540 to another portion. More specifically, the source electrode layer 640 is provided to continuously cover a part of the source-side surface SS of the n+ layer 540 and a part of the inner surface of the recess 710 (i.e., a portion including the surface of the n+ layer 540 and the surface of the p-type layer 530 across a connection line TL, which is a part of the peripheral line of the joint interface between the n+ layer 540 and the p-type layer 530 on the interface side between the p electrode layer 630 and the p-type layer 530).

The p electrode layer 630 is, on the other hand, formed on the inner surface of the recess 710 but is not formed to cover the entire inner surface of the recess 710. More specifically, the p electrode layer 630 is provided to cover only a part of a portion of the inner surface of the recess 710 defined by the p-type layer 530. The p electrode layer 630 is also provided to cover a part of the surface of the source electrode layer 640 other than a portion covered with the n+ layer 540 and the p-type layer 530 (i.e., the surface of the source electrode layer 640 on the opposite side to the surface that is in contact with the n+ layer 540 and the surfaces of the source electrode layer 640 approximately orthogonal to the source-side surface SS of the n+ layer 540). Since the p electrode layer 630 covers the surface of the source electrode layer 640 as described above, the p electrode layer 630 and the source electrode layer 640 operate at the same potential (for example, both at the ground potential).

As described above, in the semiconductor device 50 of this embodiment, the p electrode layer 630 is formed to cover the surface of the source electrode layer 640 on the opposite side to the surface of the source electrode layer 640 that is in contact with the n+ layer 540. In other words, the p electrode layer 630 and the source electrode layer 640 are formed to be stacked along the stacking direction. Accordingly, compared with a semiconductor device having a p electrode layer 630 and a source electrode layer 640 formed distant from each other, the semiconductor device 50 of the embodiment does not need an alignment margin and thereby enables miniaturization of the electrode peripheral part. This embodiment thus enables downsizing of the semiconductor device 50 and reduces the manufacturing cost of the semiconductor device 50.

Additionally, in the semiconductor device 50 of the embodiment, the source electrode layer 640 is covered with the p electrode layer 630 with regard to at least a stacked portion where the p electrode layer 630 and the source electrode layer 640 are stacked. This configuration enables the source electrode layer 640 to be made of a material without process tolerance, on the condition that a residual portion of the source electrode layer 640 other than the stacked portion is isolated by another layer from the etching process performed on the semiconductor device 50. In the semiconductor device 50 of this embodiment, this configuration accordingly enhances the flexibility in selection of the material for the source electrode layer 640.

In the semiconductor device 50 of this embodiment, the source electrode layer 640 is provided to continuously cover a portion of the inner surface of the recess 710 including the above connection line TL and a part of the surface of the p-type layer 530 adjacent to the joint interface. In the semiconductor device 50 of the embodiment, the source electrode layer 640 is accordingly in contact with a portion of the surface of the n+ layer 540 which forms the inner surface of the recess 710, in addition to a portion of the surface of the n+ layer 540 which forms the source-side surface SS. In the semiconductor device 50 of the embodiment, this configuration increases the contact area between the source electrode layer 640 and the n+ layer 540 and improves the performance of the semiconductor device 50 (decreases the on-resistance). Additionally, in the semiconductor device 50 of the embodiment, this configuration does not reduce the contact area between the source electrode layer 640 and the n+ layer 540 by the presence of the p electrode layer 630 and thereby does not increase the contact resistance, even on the assumption of a manufacturing positional deviation of the p electrode layer 630. Accordingly, this embodiment suppresses degradation of the performance of the semiconductor device 50 (e.g., increase in on-resistance).

A-2. Manufacturing Process of Semiconductor Device

Figure 2:
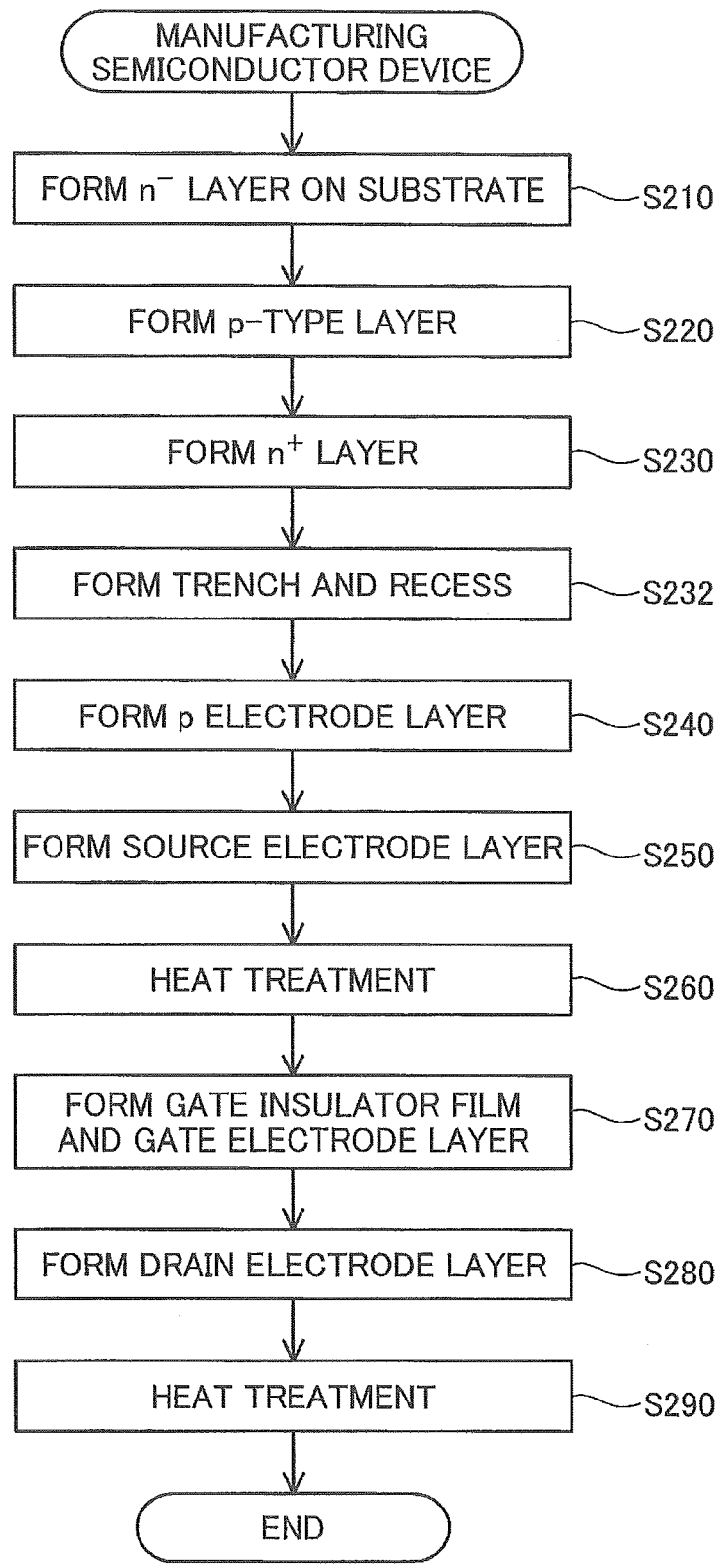
FIG. 2 is a flowchart showing a manufacturing process of the semiconductor device 50 according to the first embodiment.

FIG. 2 is a flowchart showing a manufacturing process of the semiconductor device 50 according to the first embodiment. The manufacturing process first forms the n− layer 520 on the n-type substrate 510 by crystal growth (step S210) and additionally forms the p-type layer 530 and the n+ layer 540 by crystal growth (steps S220 and S230). The manufacturing process then forms the trench 720 and the recess 710 on the source-side surface SS of the layered structure 500 by dry etching (step S232), forms the source electrode layer 640 on the n+ layer 540 (step S240) and forms the p electrode layer 630 on the p-type layer 530 (step S250) by electrode material deposition on a resist pattern by photolithography and subsequent lift-off process, and performs heat treatment for reduction of the contact resistance between the respective electrode layers and the respective semiconductor layers (step S260). This manufacturing process enables production of the small-size semiconductor device 50 having the miniaturized electrode peripheral part by stacking the p electrode layer 630 on the source electrode layer 640, thus reducing the manufacturing cost of the semiconductor device 50. According to this embodiment, heat treatment is performed simultaneously for the p electrode layer 630 and the source electrode layer 640. This ensures the good ohmic contact between each semiconductor layer and each electrode layer with respect to both the p electrode layer 630 and the source electrode layer 640 by single heat treatment.

Subsequently, the manufacturing process forms the gate insulator film 740 and the gate electrode layer 650 on the surface of the trench 720 (step S270), forms the drain electrode layer 610 on the n-type substrate 510 (step S280) and performs heat treatment for reduction of the contact resistance (step S290). The semiconductor device 50 of the embodiment is manufactured by the above process.

A-3. Modifications of Second Embodiment

Figure 3:
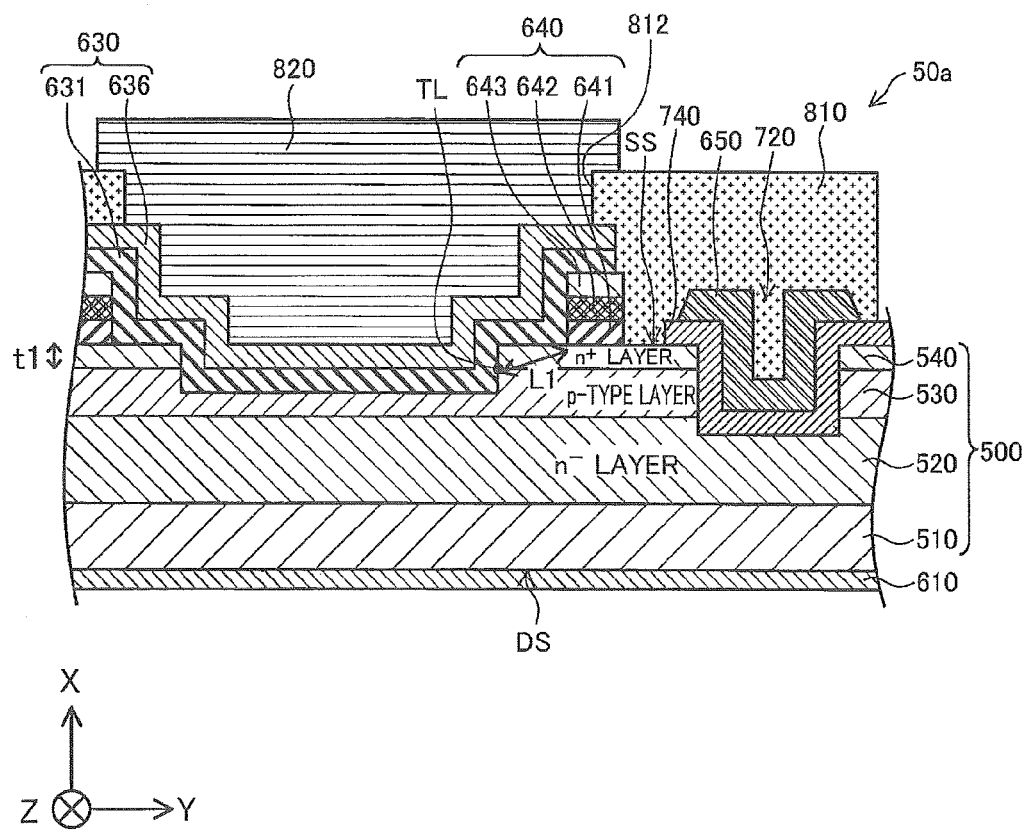
FIG. 3 is a cross sectional view schematically illustrating the configuration of a semiconductor device 50a according to a modification of the first embodiment.

FIG. 3 is a cross sectional view schematically illustrating the configuration of a semiconductor device 50a according to a modification of the first embodiment. The semiconductor device 50a according to the modification of the first embodiment differs in configuration of the source electrode layer 640 and the p electrode layer 630 and in providing an inter-layer insulator film 810 and a wiring electrode layer 820 from the semiconductor device 50 of the first embodiment illustrated in FIG. 1 but otherwise has the same configuration as that of the semiconductor device 50 of the first embodiment.

In the semiconductor device 50a according to the modification of the first embodiment, the p electrode layer 630 is formed on a specific area of the inner surface of the recess 710 that is defined by the p-type layer 530 in such a shape as to be extended from this specific area to another portion. More specifically, the p electrode layer 630 is provided to continuously cover the above specific area of the p-type layer 530, a connection line TL, which is a part of the peripheral line of the joint interface between the n+ layer 540 and the p-type layer 530 on the interface side between the p electrode layer 630 and the p-type layer 530), an area of the inner surface of the recess 710 that is defined by the n+ layer 540 and a part of the source-side surface SS of the n+ layer 540. In other words, the p electrode layer 630 is formed to be extended on the surface of the n+ layer 540 to a position on the gate electrode layer 650-side of the connection line TL. According to the modification of the first embodiment, a distance L1 from the connection line TL to a gate electrode layer 650-side end of the p electrode layer 630 on the surface of the p electrode layer 630 that is in contact with the n+ layer 540 is equal to or greater than a layer thickness t1 of the n+ layer 540. The designed value of the distance L1 is set to a sufficient distance (sufficient size), in order to enable the p electrode layer 630 to consistently cover the surface of the n+ layer 540 even in taking into consideration the alignment accuracy of a mask used for processing. The designed value of the distance L1 is set to be not less than 0.5 μm according to the modification of the first embodiment. The excessive distance L1 interferes with miniaturization of the electrode peripheral part, so that the distance L1 is preferably not greater than 20 μm. The source electrode layer 640, on the other hand, does not cover at least a portion of the surface of the n+ layer 540 including the above described connection line TL of the joint interface (this portion is covered with the p electrode layer 630).

In the semiconductor device 50a according to the modification of the first embodiment, an inter-layer insulator film 810 is formed on the layered structure 500 after formation of the respective electrodes. A contact hole 812 is formed in the inter-layer insulator film 810. The contact hole 812 is provided at a position where the p electrode layer 630 and the source electrode layer 640 are formed in the layered structure 500. A wiring electrode layer 820 is formed on the inter-layer insulator film 810. The wiring electrode layer 820 is in contact with the surface of the inter-layer insulator film 810 and the inner surface (side face) of the contact hole 812 and is electrically connected with the p electrode layer 630 via the contact hole 812. The p electrode layer 630 and the source electrode layer 640 operate at the same potential, so that the wiring electrode layer 820 is also electrically connected with the source electrode layer 640. The p electrode layer 630 is provided to cover the surface of the source electrode layer 640, so that the source electrode layer 640 is isolated from the contact hole 812.

Figure 4:
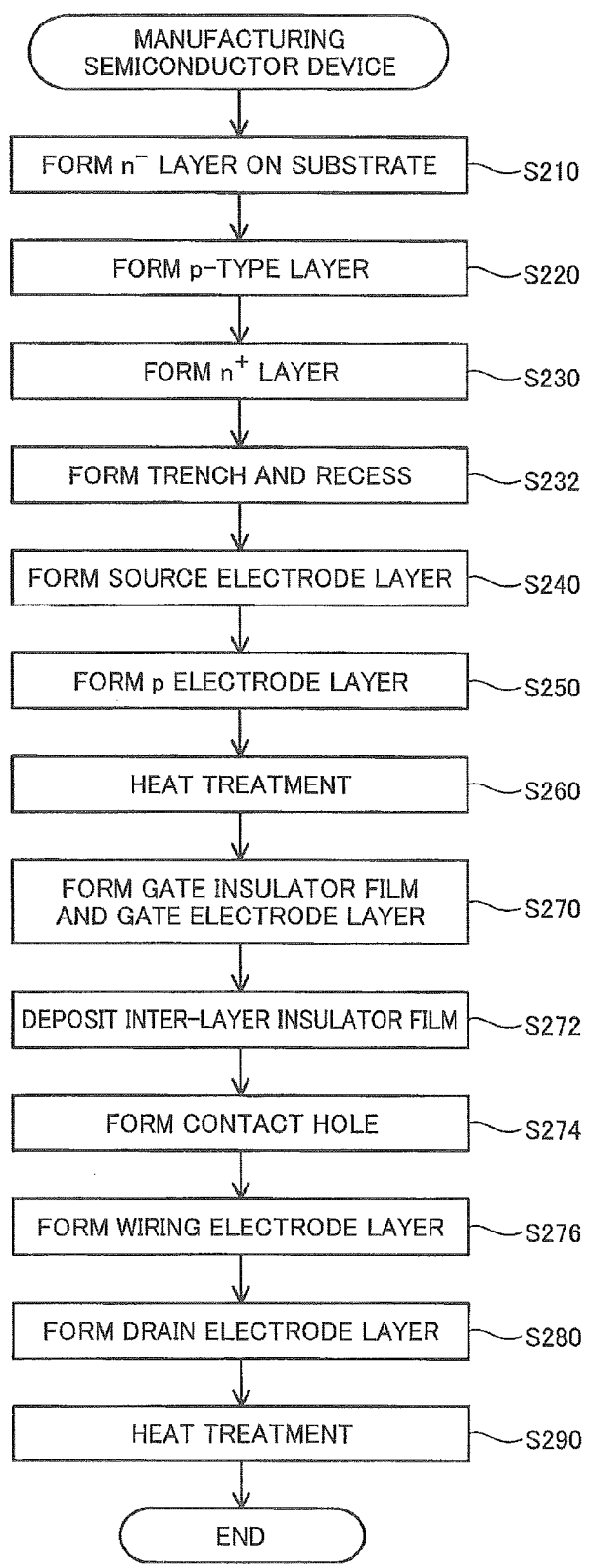
FIG. 4 is a flowchart showing a manufacturing process of the semiconductor device 50a according to the modification of the first embodiment.

FIG. 4 is a flowchart showing a manufacturing process of the semiconductor device 50a according to the modification of the first embodiment. The manufacturing process of the modification is the same as the manufacturing process of the first embodiment shown in FIG. 2 from formation of the n− layer 520 (step S210) to formation of the gate insulator film 740 and the gate electrode layer 650 (step S270). After formation of the gate insulator film 740 and the gate electrode layer 650, the manufacturing process deposits the inter-layer insulator film 810 on the layered structure 500 (step S272) and etches out a part of the inter-layer insulator film 810 to form the contact hole 812 (step S274). The manufacturing process then forms the wiring electrode layer 820 to be connected with the p electrode layer 630 via the contact hole 812 (step S276). Subsequently, in the same manner as the manufacturing process of the first embodiment, the manufacturing process forms the drain electrode layer 610 (step S280) and performs heat treatment for reduction of the contact resistance (step S290). The semiconductor device 50a according to the modification of the first embodiment is manufactured by the above process.

As described above, in the semiconductor device 50a according to the modification of the first embodiment, the p electrode layer 630 is formed to be extended on the surface of the n+ layer 540 to a position on the gate electrode layer 650-side of the connection line TL. Accordingly, the semiconductor device 50a according to the modification of the first embodiment enables a hole formed in the vicinity of the gate electrode layer 650 under application of a high voltage to be effectively pulled out by the p electrode layer 630 and improves the pressure resistance of the semiconductor device 50a. Additionally, in the semiconductor device 50a according to the modification of the first embodiment, the distance L1 from the above described connection line TL to the gate electrode layer 650-side end of the p electrode layer 630 on the surface of the p electrode layer 630 that is in contact with the n+ layer 540 is equal to or greater than the layer thickness t1 of the n+ layer 540. This configuration enables a hole to be effectively pulled out by the p electrode layer 630 without being interfered with by the n+ layer 540, thus effectively improving the pressure resistance.

In the semiconductor device 50a according to the modification of the first embodiment, the p electrode layer 630 is in contact with the p-type layer 530 on side faces of the inner surface of the recess 710 which are defined by the p-type layer 530 and the n+ layer 540 in addition to a bottom face of the inner surface of the recess 710 which is defined by the p-type layer 530. This configuration enables a hole to be more effectively pulled out by the p electrode layer 630 and more effectively improves the pressure resistance.

In the semiconductor device 50a according to the modification of the first embodiment, the p electrode layer 630 is provided to cover the surface of the source electrode layer 640, such that the source electrode layer 640 is isolated from the contact hole 812. As long as the p electrode layer 630 is made of a material having process tolerance, this configuration enables the contact hole 812 to be formed without causing adverse effect on the source electrode layer 640 and enables the wiring electrode layer 820 to be electrically connected with the p electrode layer 630 and the source electrode layer 640 in the etching process for formation of the contact hole 812, even when the source electrode layer 640 is made of a material without the process tolerance. In the semiconductor device 50a according to the modification of the first embodiment, this enhances the flexibility in selection of the material for the source electrode layer 640.

A-4. Evaluation of Performance

Figure 5:
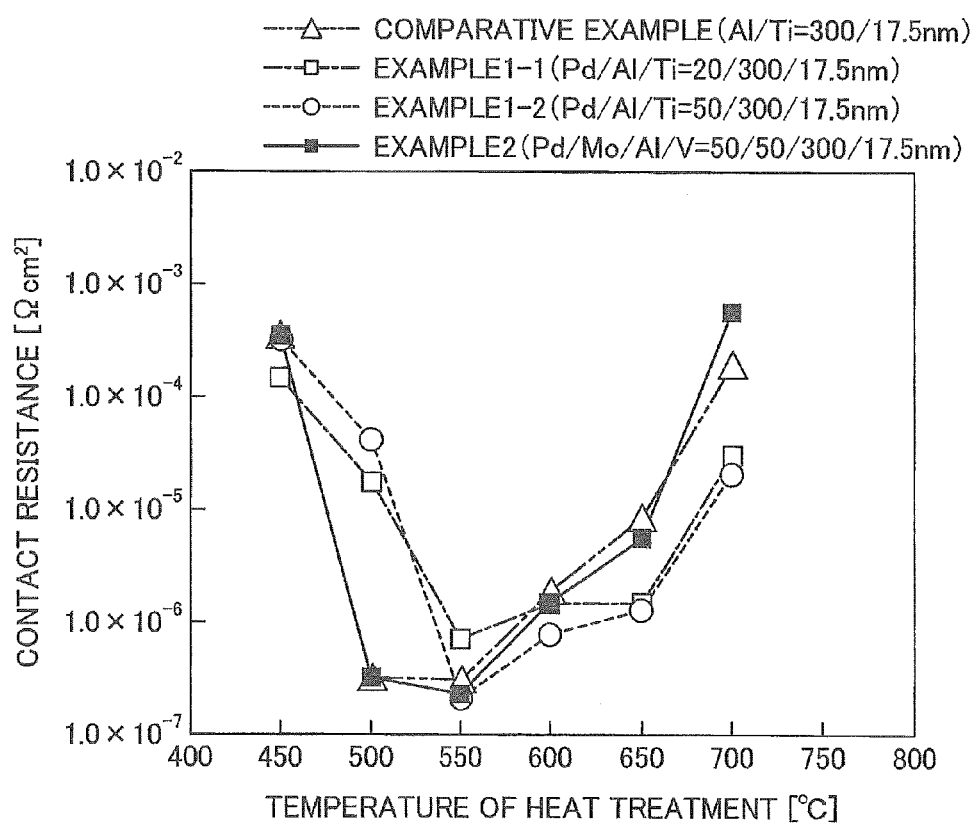
FIG. 5 is a diagram showing an example of the experimental result for evaluating performance of the semiconductor device according to the first embodiment and its modification.
Figure 6:
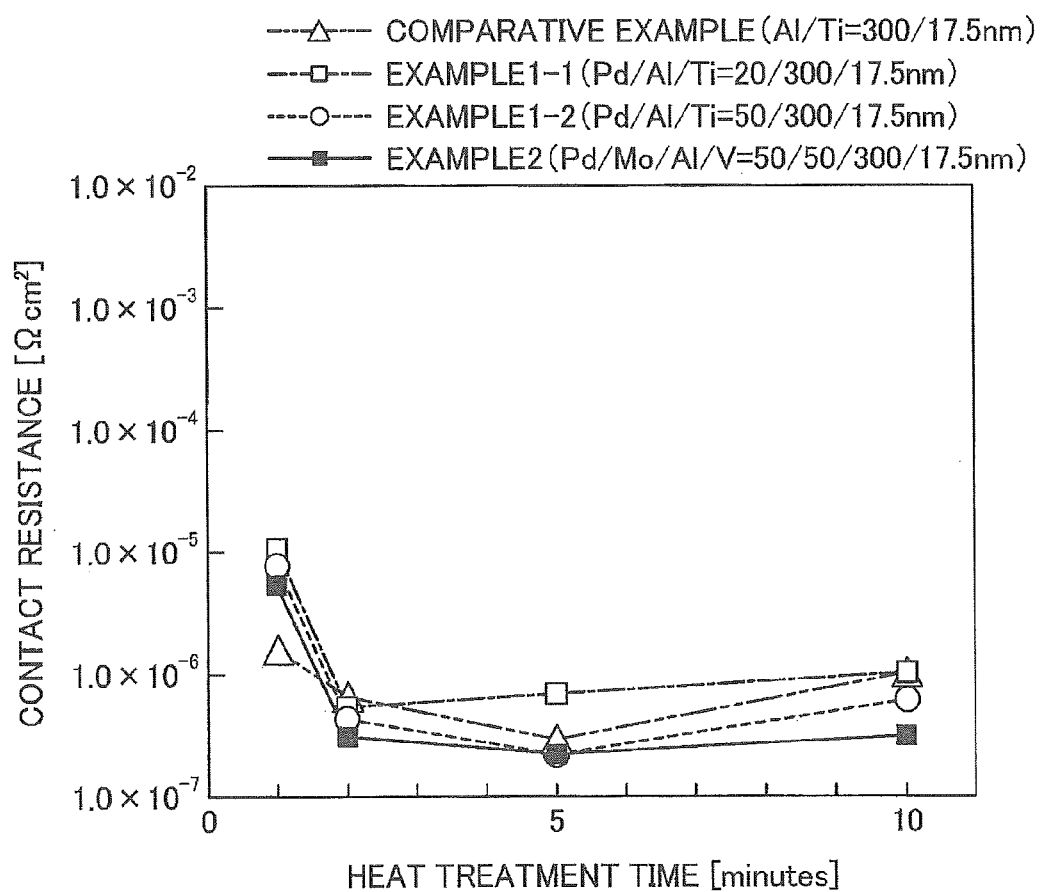
FIG. 6 is a diagram showing an example of the experimental result for evaluating performance of the semiconductor device according to the first embodiment and its modification.
Figure 7:
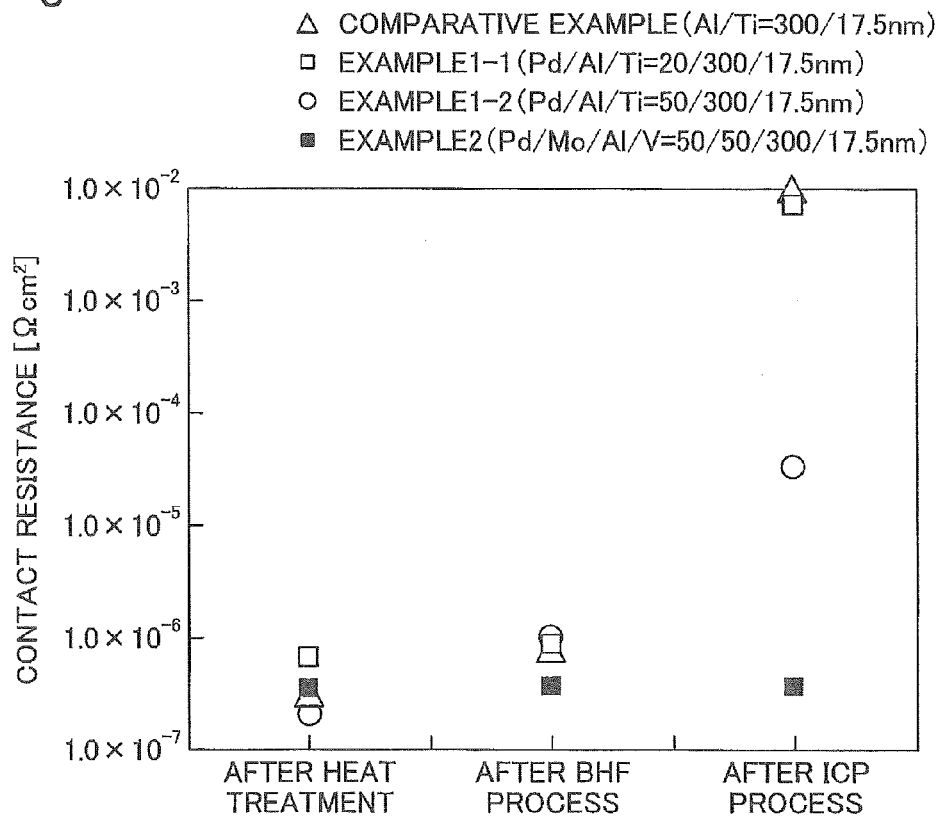
FIG. 7 is a diagram showing an example of the experimental result for evaluating performance of the semiconductor device according to the first embodiment and its modification.

FIGS. 5 to 7 are diagrams showing an example of experimental results for evaluation of the performance of the semiconductor devices according to the first embodiment (and its modification). The following describes the structures of the respective electrode layers in Examples and Comparative Example used for the experiments.

Example 1-1

* p electrode layer 630:
    p contact formation layer 631: (material) palladium (Pd), (layer thickness) 20 nm
    p cap layer 636: not exist
* source electrode layer 640
    first n contact formation layer 641: (material) titanium (Ti), (layer thickness) 17.5 nm
    second n contact formation layer 642: (material) aluminum (Al), (layer thickness) 300 nm
    n barrier layer 643: (material) palladium (Pd), (layer thickness) 20 nm
* In this Example, a single palladium layer serves as both the p contact formation layer 631 and the n barrier layer 643.

Example 1-2

* p electrode layer 630:
    p contact formation layer 631: (material) palladium (Pd), (layer thickness) 50 nm
    p cap layer 636: not exist
* source electrode layer 640
    first n contact formation layer 641: (material) titanium (Ti), (layer thickness) 17.5 nm
    second n contact formation layer 642: (material) aluminum (Al), (layer thickness) 300 nm
    n barrier layer 643: (material) palladium (Pd), (layer thickness) 50 nm
* In this Example, a single palladium layer serves as both the p contact formation layer 631 and the n barrier layer 643.

Example 2

* p electrode layer 630:
    p contact formation layer 631: (material) palladium (Pd), (layer thickness) 50 nm
    p cap layer 636: not exist
* source electrode layer 640
    first n contact formation layer 641: (material) vanadium (V), (layer thickness) 17.5 nm
    second n contact formation layer 642: (material) aluminum (Al), (layer thickness) 300 nm
    n barrier layer 643: (material) molybdenum (Mo), (layer thickness) 50 nm Comparative Example

* source electrode layer 640
    first n contact formation layer 641: (material) titanium (Ti), (layer thickness) 17.5 nm
    second n contact formation layer 642: (material) aluminum (Al), (layer thickness) 300 nm
    n barrier layer 643: not exist
* This Comparative Example includes the source electrode layer 640 alone (in other words, the p electrode layer 630 is not formed on the source electrode layer 640).

FIG. 5 shows the measured values of the contact resistance between the source electrode layer 640 and the n+ layer 540 when heat treatment was performed under nitrogen atmosphere for 5 minutes at each temperature with respect to the respective Examples and Comparative Example. In the respective Examples, when the temperature of heat treatment was not lower than 450 degrees centigrade and not higher than 700 degrees centigrade, the contact resistance was as sufficiently low as about $1.0 \times 10^{-3}$ ($\Omega cm^2$) or lower. This indicates the good ohmic contact between the source electrode layer 640 and the n+ layer 540. In Example 2, as in the case of Comparative Example, when the temperature of heat treatment was not lower than 500 degrees centigrade and not higher than 650 degrees centigrade, the contact resistance was as extremely low as about $1.0 \times 10^{-5}$ ($\Omega cm^2$) or lower. This indicates the extremely good ohmic contact between the source electrode layer 640 and the n+ layer 540. In Examples 1, when the temperature of heat treatment was not lower than 550 degrees centigrade and not higher than 650 degrees centigrade, the contact resistance was as extremely low as about $1.0 \times 10^{-5}$ ($\Omega cm^2$) or lower. This indicates the extremely good ohmic contact between the source electrode layer 640 and the n+ layer 540. These experimental results show that the temperature of heat treatment is preferably not lower than 450 degrees centigrade and not higher than 700 degrees centigrade, is more preferably not lower than 500 degrees centigrade and not higher than 650 degrees centigrade, and is furthermore preferably not lower than 550 degrees centigrade and not higher than 650 degrees centigrade.

FIG. 6 shows the measured values of the contact resistance between the source electrode layer 640 and the n+ layer 540 when heat treatment was performed under nitrogen atmosphere for various duration times at 550 degrees centigrade with respect to the respective Examples and Comparative Example. In the respective Examples, as in the case of Comparative Example, when the duration time of heat treatment was not less than 1 minute, the contact resistance was as extremely low as about $1.0 \times 10^{-5}$ ($\Omega cm^2$) or lower. This indicates the extremely good ohmic contact between the source electrode layer 640 and the n+ layer 540. In the respective Examples, as in the case of Comparative Example, when the duration time of heat treatment was not less than 2 minutes, the contact resistance was as further lower as about $1.0 \times 10^{-6}$ ($\Omega cm^2$) or lower. This indicates the further better ohmic contact between the source electrode layer 640 and the n+ layer 540. The maximum duration time in the experiments was 10 minutes. In terms of inhibiting the reaction between electrodes and shortening the time required for production of semiconductor devices, the duration time of heat treatment is preferably not greater than 1 hour and is more preferably not greater than 10 minutes. These experimental results show that the duration time of heat treatment is preferably not less than 1 minute and not greater than 1 hour and is more preferably not less than 2 minutes and not greater than 10 minutes.

FIG. 7 shows the measured values of the contact resistance between the source electrode layer 640 and the n+ layer 540 when etching processes were performed after heat treatment with respect to the respective Examples and Comparative Example, for the purpose of evaluation of the etch resistance of the electrode. The etching processes performed were BHF process (wet etching process using an aqueous solution of buffered hydrofluoric acid) and ICP process (chlorine-based dry etching process by inductive coupled plasma using a Cl-based gas). The process time was set to 1 minute, which is expected to be sufficient for formation of a contact hole for wiring. In Examples 1-1 and 1-2 and Comparative Example, after the BHF process, the contact resistance slightly increased but was still kept at an extremely low level as about $1.0 \times 10^{-6}$ ($\Omega cm^2$) or lower. This indicates the extremely good ohmic contact maintained between the source electrode layer 640 and the n+ layer 540. In Example 2 where the n barrier layer 643 was provided separately from the p contact formation layer 631, no substantial increase in contact resistance was observed after the BHF process. In Example 1-1 and Comparative Example, after the ICP process, the contact resistance significantly increased, and the ohmic contact between the source electrode layer 640 and the n+ layer 540 was degraded. In Example 1-2 including the thicker palladium layer than that of Example 1-1, the contact resistance increased but was still at a low level as about $1.0 \times 10^{-4}$ ($\Omega cm^2$) or lower. This indicates the good ohmic contact maintained between the source electrode layer 640 and the n+ layer 540. In Example 2 where the n barrier layer 643 was provided separately from the p contact formation layer 631, no substantial increase in contact resistance was observed after the ICP process.

Examples of the p electrode layer 630 without the p cap layer 636 were subject to the evaluation of the performance described above. The above evaluation of the performance may be similarly performed for examples of the p electrode layer 630 having the p cap layer 636 structured as described above, and similar results may be estimated. The above evaluation of the performance may also be similarly performed for examples using other materials described above in place of the materials of the respective electrodes in the above examples subject to the performance evaluation, and similar results may be estimated.

B. Second Embodiment

B-1. Configuration of Semiconductor Device

Figure 8:
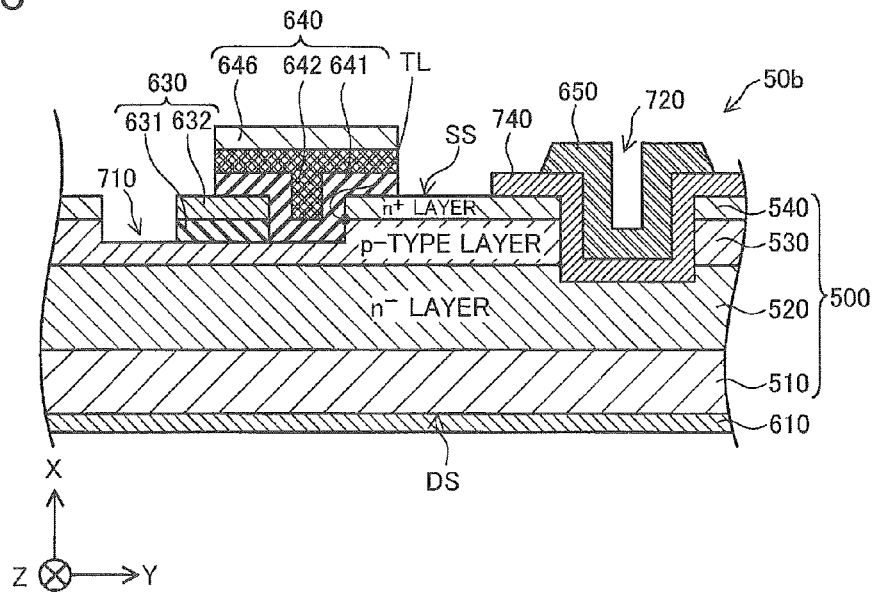
FIG. 8 is a cross sectional view schematically illustrating the configuration of a semiconductor device 50b according to a second embodiment.

FIG. 8 is a cross sectional view schematically illustrating the configuration of a semiconductor device 50b according to a second embodiment. The semiconductor device 50b according to the second embodiment differs in configuration of the source electrode layer 640 and the p electrode layer 630 from the semiconductor device 50 of the first embodiment illustrated in FIG. 1 but otherwise has the same configuration as that of the semiconductor device 50 of the first embodiment.

A p electrode layer 630 is provided in a portion of the inner surface of the recess 710 defined by the p-type layer 530. The p electrode layer 630 corresponds to the second electrode layer of the claims. The p electrode layer 630 has a two-layer structure of a p contact formation layer 631 that is in contact with the p-type layer 530 and a p barrier layer 632 that is formed on the p contact formation layer 631. The p contact formation layer 631 is made of palladium (Pd), and the p barrier layer 632 is made of molybdenum (Mo). The layer thickness of the p contact formation layer 631 is preferably not less than 3 nm and not greater than 1000 nm. Controlling the layer thickness of the p contact formation layer 631 to this range maintains the substantially ohmic contact between the p electrode layer 630 and the p-type layer 530, while avoiding potential problems caused by the excessive layer thickness of the p electrode layer 630: for example, the complicated formation process and the increased material cost. The layer thickness of the p contact formation layer 631 is more preferably not less than 5 nm and not greater than 500 nm. Controlling the layer thickness of the p contact formation layer 631 to this range further restricts the layer thickness of the p electrode layer 630 and more effectively avoids the above problems, while maintaining the better ohmic contact between the p electrode layer 630 and the p-type layer 530. The layer thickness of the p barrier layer 632 is preferably not less than 3 nm and not greater than 1000 nm. Controlling the layer thickness of the p barrier layer 632 to this range prevents the excessive layer thickness of the p electrode layer 630, while inhibiting the reaction between the p electrode layer 630 and the source electrode layer 640. The layer thickness of the p barrier layer 632 is more preferably not less than 5 nm and not greater than 500 nm. Controlling the layer thickness of the p barrier layer 632 to this range further restricts the layer thickness of the p electrode layer 630 and more effectively avoids the above problems, while more effectively inhibiting the reaction between the p electrode layer 630 and the source electrode layer 640.

A source electrode layer 640 is provided on the source-side surface SS of the n+ layer 540. The source electrode layer 640 corresponds to the first electrode layer of the claims. The source electrode layer 640 has a three-layer structure of a first n contact formation layer 641 that is in contact with the n+ layer 540, a second n contact formation layer 642 that is formed on the first n contact formation layer 641 and an n cap layer 646 that is formed on the second n contact formation layer 642. The first n contact formation layer 641 is made of titanium (Ti), the second n contact formation layer 642 is made of aluminum (Al) and the n cap layer 646 is made of vanadium (V). The layer thickness of the first n contact formation layer 641 is preferably not less than 3 nm and not greater than 100 nm. Controlling the layer thickness of the first n contact formation layer 641 to this range prevents the excessive layer thickness of the first n contact formation layer 641 and avoids the problems such as a complicated formation process and an increased material cost caused by this excessive layer thickness, while maintaining the substantially ohmic contact between the source electrode layer 640 and the n+ layer 540. The layer thickness of the first n contact formation layer 641 is more preferably not less than 5 nm and not greater than 50 nm. Controlling the layer thickness of the first n contact formation layer 641 to this range further restricts the layer thickness of the first n contact formation layer 641 and more effectively avoids the above problems, while maintaining the better ohmic contact between the source electrode layer 640 and the n+ layer 540. The layer thickness of the second n contact formation layer 642 is preferably not less than 100 nm and not greater than 100 μm. Controlling the layer thickness of the second n contact formation layer 642 to this range prevents the excessive layer thickness of the second n contact formation layer 642 and avoids the problems such as a complicated formation process and an increased material cost caused by this excessive layer thickness, while maintaining the better ohmic contact between the source electrode layer 640 and the n+ layer 540. The layer thickness of the second n contact formation layer 642 is more preferably not less than 200 nm and not greater than 50 μm. Controlling the layer thickness of the second n contact formation layer 642 to this range further restricts the layer thickness of the second n contact formation layer 642 and more effectively avoids the above problems, while maintaining the further better ohmic contact between the source electrode layer 640 and the n+ layer 540. The layer thickness of the second n contact formation layer 642 is furthermore preferably not less than 300 nm and not greater than 10 μm. Controlling the layer thickness of the second n contact formation layer 642 to this range additionally restricts the layer thickness of the second n contact formation layer 642 and furthermore effectively avoids the above problems, while maintaining the furthermore better ohmic contact between the source electrode layer 640 and the n+ layer 540. The layer thickness of the n cap layer 646 is preferably not less than 3 nm and not greater than 100 μm. Controlling the layer thickness of the n cap layer 646 to this range allows the n cap layer 646 to have sufficient etch resistance and thereby enables a material without etch resistance to be used as the material for the first n contact formation layer 641 and the second n contact formation layer 642 in the case of formation of a contact hole after formation of an inter-layer insulator film on the source electrode layer 640. This enhances the flexibility in selection of the material for the first n contact formation layer 641 and the second n contact formation layer 642. Such controlling also prevents the excessive layer thickness of the n cap layer 646 and avoids the problems such as a complicated formation process and an increased material cost caused by this excessive layer thickness. The layer thickness of the n cap layer 646 is more preferably not less than 5 nm and not greater than 50 μm. Controlling the layer thickness of the n cap layer 646 to this range further restricts the layer thickness of the n cap layer 646 and more effectively avoids the above problems, while further enhancing the etch resistance of the n cap layer 646. The layer thickness of the n cap layer 646 is furthermore preferably not less than 5 nm and not greater than 10 μm. Controlling the layer thickness of the n cap layer 646 to this range additionally restricts the layer thickness of the n cap layer 646 and furthermore effectively avoids the above problems. The detailed structures of the p electrode layer 630 and the source electrode layer 640 will be described later.

The p contact formation layer 631 may be formed by containing at least one metal selected from the group consisting of nickel (Ni), palladium (Pd) and platinum (Pt) or an alloy of the selected metal. This ensures the substantially ohmic contact between the p electrode layer 630 and the p-type layer 530. The p barrier layer 632 may be formed by containing at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal. This inhibits the reaction of the p electrode layer 630 with the source electrode layer 640.

The first n contact formation layer 641 may be formed by containing at least one metal selected from the group consisting of hafnium (Hf), titanium (Ti) and vanadium (V) or an alloy of the selected metal. This ensures the substantially ohmic contact between the source electrode layer 640 and the n+ layer 540. The second n contact formation layer 642 may be formed by containing aluminum (Al) or an aluminum (Al) alloy. This ensures the good ohmic contact between the source electrode layer 640 and the n+ layer 540. The n cap layer 646 may be formed by containing at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal. This causes the source electrode layer 640 to include the n cap layer 646 having the etch resistance. In the process of forming a contact hole after formation of an inter-layer insulator film on the source electrode layer 640, a material without the etch resistance may thus be employed as the material for the first n contact formation layer 641 or the material for the second n contact formation layer 642. This enhances the flexibility in selection of the material for the first n contact formation layer 641 and the material for the second n contact formation layer 642.

The number of layers constituting the p electrode layer 630 or the source electrode layer 640 may be set arbitrarily. For example, the p electrode layer 630 may be in a single-layer structure of the p contact formation layer 631. The source electrode layer 640 may be in a single-layer structure of the first n contact formation layer 641 or in a two-layer structure of the first n contact formation layer 641 and the second n contact formation layer 642.

The p electrode layer 630 is formed on the inner surface of the recess 710 but is not formed to cover the entire inner surface of the recess 710. More specifically, the p electrode layer 630 is provided to cover only a part of a portion of the inner surface of the recess 710 defined by the p-type layer 530.

The source electrode layer 640 is, on the other hand, formed on the source-side surface SS of the n+ layer 540 in such a shape as to be extended from the source-side surface SS of the n+ layer 540 further to another portion. More specifically, the source electrode layer 640 is provided to continuously cover a part of the source-side surface SS of the n+ layer 540, a part of the inner surface of the recess 710 (i.e., a portion including the surface of the n+ layer 540 and the surface of the p-type layer 530 across a connection line TL, which is a part of the peripheral line of the joint interface between the n+ layer 540 and the p-type layer 530 on the interface side between the p electrode layer 630 and the p-type layer 530), and a part of the surface of the p electrode layer 630 (i.e., a portion including a part of the surface on the opposite side to the surface that is in contact with the p-type layer 530). Since the source electrode layer 640 covers the surface of the p electrode layer 630 as described above, the p electrode layer 630 and the source electrode layer 640 operate at the same potential (for example, both at the ground potential). Additionally, a designed distance from the above described connection line TL of the joint interface to the p electrode layer 630 (i.e., designed size of the surface of the p-type layer 530 covered with the source electrode layer 640) is set to a sufficient distance (sufficient size), in order to enable a part of the surface of the p-type layer 530 to be covered with the source electrode layer 640 even on the assumption of a maximum manufacturing positional deviation.

As described above, in the semiconductor device 50b of this embodiment, the source electrode layer 640 is formed to cover the surface of the p electrode layer 630 on the opposite side to the surface of the p electrode layer 630 that is in contact with the p-type layer 530. In other words, the p electrode layer 630 and the source electrode layer 640 are formed to be stacked along the stacking direction. Accordingly, compared with a semiconductor device having a p electrode layer 630 and a source electrode layer 640 formed distant from each other, the semiconductor device 50b of the embodiment does not need an alignment margin and thereby enables miniaturization of the electrode peripheral part. This embodiment thus enables downsizing of the semiconductor device 50b and reduces the manufacturing cost of the semiconductor device 50b.

In the semiconductor device 50b of this embodiment, the source electrode layer 640 is provided to continuously cover: a portion of the inner surface of the recess 710 which defines the above described connection line TL of the joint interface; and a part of the surface of the p-type layer 530 adjacent to the connection line TL. In the semiconductor device 50b of the embodiment, the source electrode layer 640 is accordingly in contact with a portion of the surface of the n+ layer 540 which forms the inner surface of the recess 710, in addition to a portion of the surface of the n+ layer 540 which forms the source-side surface SS. In the semiconductor device 50b of the embodiment, this configuration increases the contact area between the source electrode layer 640 and the n+ layer 540 and improves the performance of the semiconductor device 50b (decreases the on-resistance). Additionally, in the semiconductor device 50b of the embodiment, this configuration does not reduce the contact area between the source electrode layer 640 and the n+ layer 540 by the presence of the p electrode layer 630 and thereby does not increase the contact resistance, even on the assumption of a manufacturing positional deviation of the p electrode layer 630. Accordingly, this embodiment suppresses degradation of the performance of the semiconductor device 50b (e.g., increase in on-resistance).

B-2. Manufacturing Process of Semiconductor Device

Figure 9:
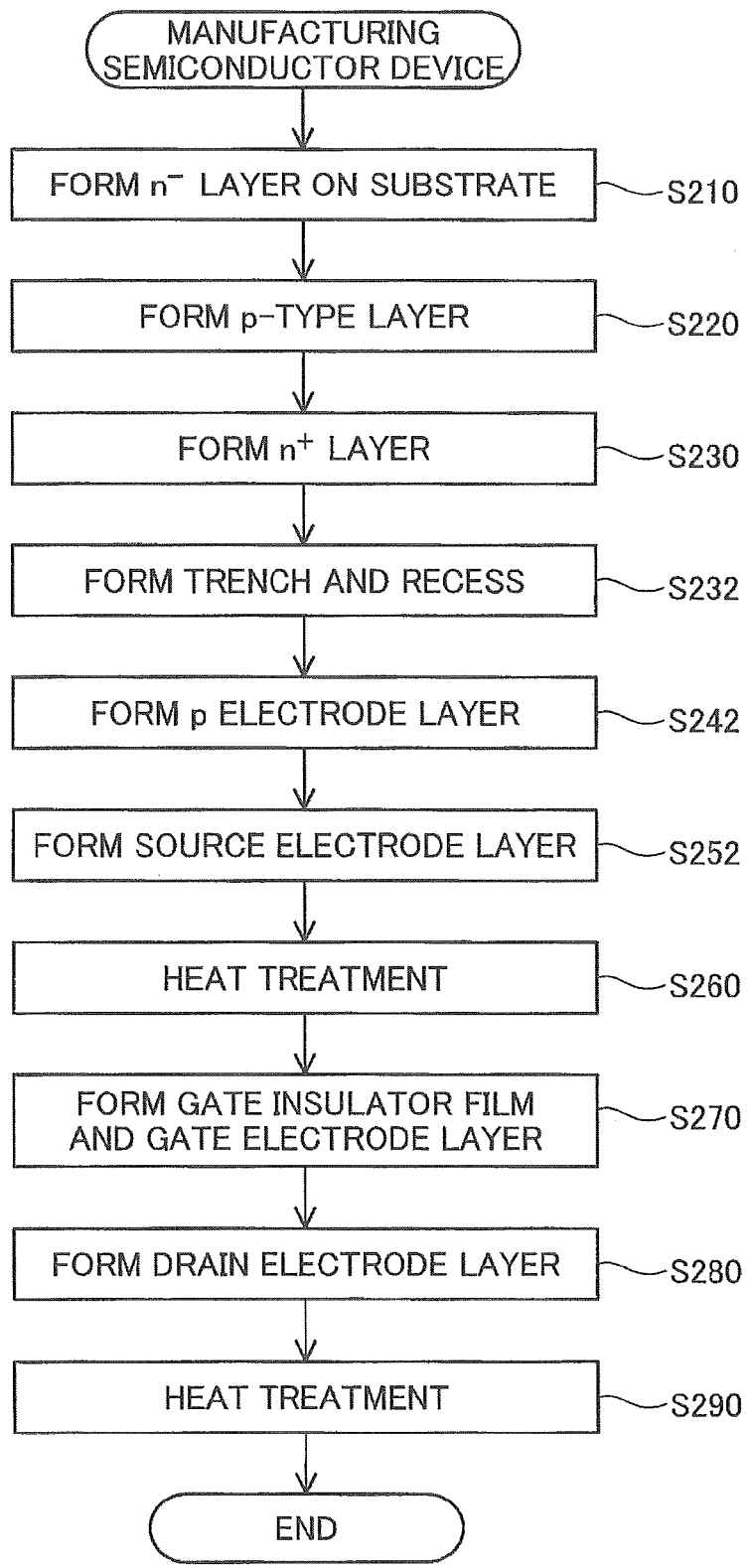
FIG. 9 is a flowchart showing a manufacturing process of the semiconductor device 50b according to the second embodiment.

FIG. 9 is a flowchart showing a manufacturing process of the semiconductor device 50b according to the second embodiment. The manufacturing process of the semiconductor device 50b according to the second embodiment differs in order of formation of the source electrode layer 640 and the p electrode layer 630 from the manufacturing process of the first embodiment shown in FIG. 2, but the other steps are identical with those in the manufacturing process of the first embodiment.

Specifically, the steps from formation of the n− layer 520 (step S210) to formation of the trench 720 and the recess 710 (step S232) are identical with those in the manufacturing process of the first embodiment shown in FIG. 2. The manufacturing process subsequently forms the p electrode layer 630 on the p-type layer 530 (step S242) and forms the source electrode layer 640 on the n+ layer 540 (step S252) by electrode material deposition on a resist pattern by photolithography and subsequent lift-off process. The manufacturing process then performs heat treatment for reduction of the contact resistance between the respective electrode layers and the respective semiconductor layers (step S260). This manufacturing process enables production of the small-size semiconductor device 50b having the miniaturized electrode peripheral part by stacking the source electrode layer 640 on the p electrode layer 630, thus reducing the manufacturing cost of the semiconductor device 50b. According to this embodiment, heat treatment is performed simultaneously for the p electrode layer 630 and the source electrode layer 640. This ensures the good ohmic contact between each semiconductor layer and each electrode layer with respect to both the p electrode layer 630 and the source electrode layer 640 by single heat treatment. The subsequent steps are identical with those in the manufacturing process of the first embodiment shown in FIG. 2. The semiconductor device 50b of the second embodiment is manufactured by the above process.

B-3. Modification of Second Embodiment

Figure 10:
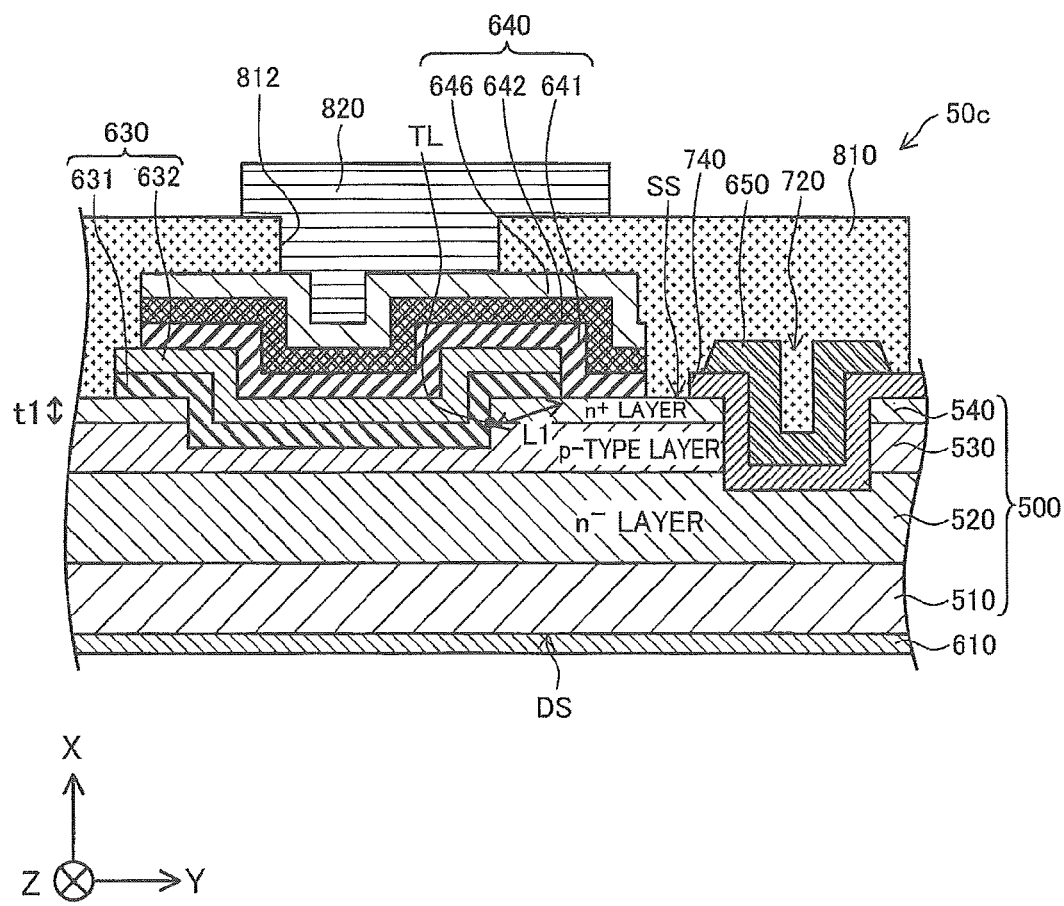
FIG. 10 is a cross sectional view schematically illustrating the configuration of a semiconductor device 50c according to a modification of the second embodiment.

FIG. 10 is a cross sectional view schematically illustrating the configuration of a semiconductor device 50c according to a modification of the second embodiment. The semiconductor device 50c according to the modification of the second embodiment differs in configuration of the source electrode layer 640 and the p electrode layer 630 and in providing an inter-layer insulator film 810 and a wiring electrode layer 820 from the semiconductor device 50b of the second embodiment illustrated in FIG. 8 but otherwise has the same configuration as that of the semiconductor device 50b of the second embodiment.

In the modification of the second embodiment, the p electrode layer 630 is formed on a specific area of the inner surface of the recess 710, which is defined by the p-type layer 530, and is formed in a shape to be extended from this specific area to another part. More specifically, the p electrode layer 630 is provided to continuously cover the above described specific area of the p-type layer 530, a connection line TL, which is a part of the peripheral line of the joint interface between the n+ layer 540 and the p-type layer 530 on the interface side between the p electrode layer 630 and the p-type layer 530, an area of the inner surface of the recess 710, which is defined by the n+ layer 540, and a part of the source-side surface SS of the n+ layer 540. In other words, the p electrode layer 630 is formed to be extended on the surface of the n+ layer 540 to a position on a gate electrode layer 650- side of the above described connection line TL where the p electrode layer 630 is connected with the above described joint interface. According to the modification of the second embodiment, a distance L1 from the connection line TL to a gate electrode layer 650-side end of the p electrode layer 630 on the surface of the p electrode layer 630 that is in contact with the n+ layer 540 is equal to or greater than a layer thickness t1 of the n+ layer 540. The designed value of the distance L1 is set to a sufficient distance (sufficient size), in order to enable the p electrode layer 630 to consistently cover the surface of the n+ layer 540 even in taking into consideration the alignment accuracy of a mask used for processing. The designed value of the distance L1 is set to be not less than 0.5 nm according to the modification of the second embodiment. The excessive distance L1 interferes with miniaturization of the electrode peripheral part, so that the distance L1 is preferably not greater than 20 nm. The source electrode layer 640, on the other hand, does not cover at least a portion of the surface of the n+ layer 540, which forms the above described connection line TL of the joint interface (this portion is covered with the p electrode layer 630).

In the semiconductor device 50c according to the modification of the second embodiment, an inter-layer insulator film 810 is formed on the layered structure 500 after formation of the respective electrodes. A contact hole 812 is formed in the inter-layer insulator film 810. The contact hole 812 is provided at a position where the p electrode layer 630 and the source electrode layer 640 are formed in the layered structure 500. A wiring electrode layer 820 is formed on the inter-layer insulator film 810. The wiring electrode layer 820 is in contact with the surface of the inter-layer insulator film 810 and the inner surface (side face) of the contact hole 812 and is electrically connected with the source electrode layer 640 via the contact hole 812. The p electrode layer 630 and the source electrode layer 640 operate at the same potential, so that the wiring electrode layer 820 is also electrically connected with the p electrode layer 630. The source electrode layer 640 is provided to cover the surface of the p electrode layer 630, so that the p electrode layer 630 is isolated from the contact hole 812.

Figure 11:
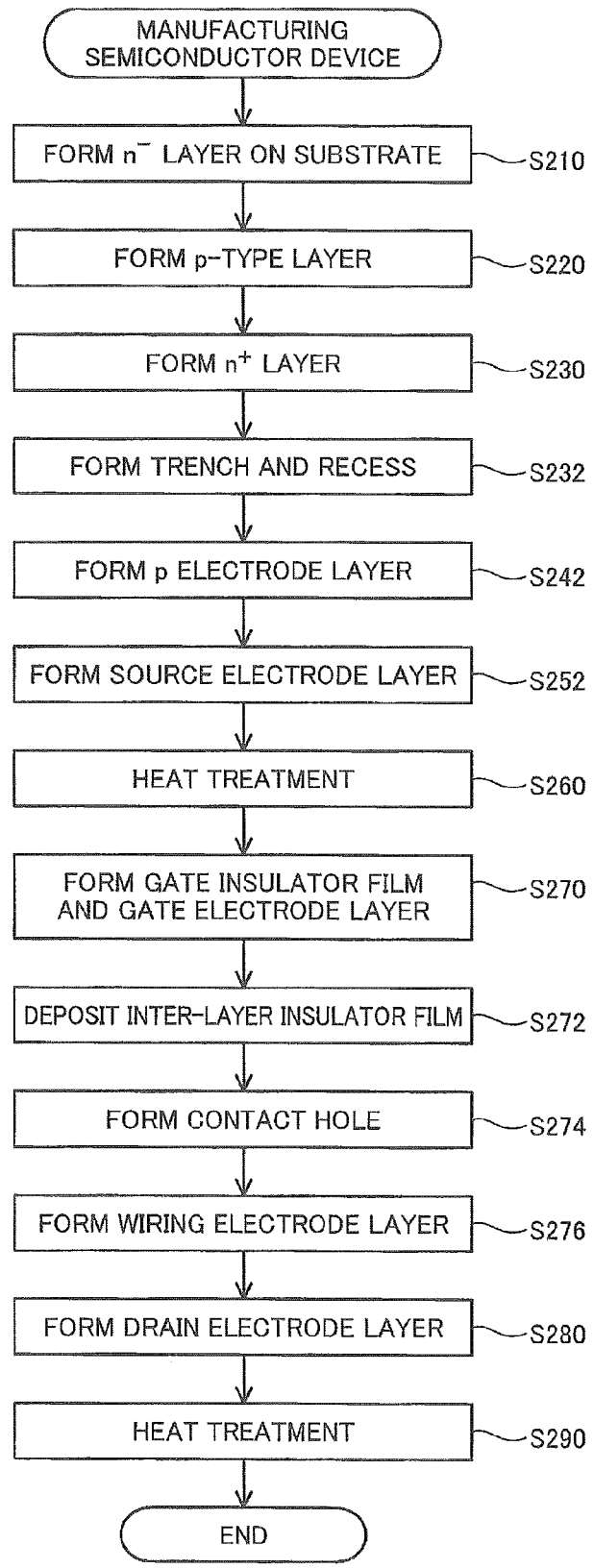
FIG. 11 is a flowchart showing a manufacturing process of the semiconductor device 50c according to the modification of the second embodiment.

FIG. 11 is a flowchart showing a manufacturing process of the semiconductor device 50c according to the modification of the second embodiment. The manufacturing process of the modification is the same as the manufacturing process of the second embodiment shown in FIG. 9 from formation of the n− layer 520 (step S210) to formation of the gate insulator film 740 and the gate electrode layer 650 (step S270). After formation of the gate insulator film 740 and the gate electrode layer 650, the manufacturing process deposits the inter-layer insulator film 810 on the layered structure 500 (step S272) and etches out a part of the inter-layer insulator film 810 to form the contact hole 812 (step S274). The manufacturing process then forms the wiring electrode layer 820 to be connected with the source electrode layer 640 via the contact hole 812 (step S276). Subsequently, in the same manner as the manufacturing process of the second embodiment, the manufacturing process forms the drain electrode layer 610 (step S280) and performs heat treatment for reduction of the contact resistance (step S290). The semiconductor device 50c according to the modification of the second embodiment is manufactured by the above process.

As described above, in the semiconductor device 50c according to the modification of the second embodiment, the p electrode layer 630 is formed to be extended on the surface of the n+ layer 540 to a position on the gate electrode layer 650-side of the connection line TL. Accordingly, the semiconductor device 50c according to the modification of the second embodiment enables a hole formed in the vicinity of the gate electrode layer 650 under application of a high voltage to be effectively pulled out by the p electrode layer 630 and improves the pressure resistance of the semiconductor device 50c. Additionally, in the semiconductor device 50c according to the modification of the second embodiment, the distance L1 from the above described connection line TL to the gate electrode layer 650-side end of the p electrode layer 630 on the surface of the p electrode layer 630 that is in contact with the n+ layer 540 is equal to or greater than the layer thickness t1 of the n+ layer 540. This configuration enables a hole to be effectively pulled out by the p electrode layer 630 without being interfered with by the n+ layer 540, thus effectively improving the pressure resistance.

In the semiconductor device 50c according to the modification of the second embodiment, the p electrode layer 630 is in contact with the p-type layer 530 on side faces of the inner surface of the recess 710 which are defined by the p-type layer 530 and the n+ layer 540 in addition to a bottom face of the inner surface of the recess 710 which is defined by the p-type layer 530. This configuration enables a hole to be more effectively pulled out by the p electrode layer 630 and more effectively improves the pressure resistance.

In the semiconductor device 50c according to the modification of the second embodiment, the source electrode layer 640 is provided to cover the surface of the p electrode layer 630, so that the p electrode layer 630 is isolated from the contact hole 812. As long as the source electrode layer 640 is made of a material having process tolerance, this arrangement enables the contact hole 812 to be formed without causing adverse effect on the p electrode layer 630 and enables the wiring electrode layer 820 to be electrically connected with the p electrode layer 630 and the source electrode layer 640 in the etching process for formation of the contact hole 812, even when the p electrode layer 630 is made of a material without the process tolerance. In the semiconductor device 50c according to the modification of the second embodiment, this enhances the flexibility in selection of the material for the p electrode layer 630.

B-4. Evaluation of Performance

Figure 12:
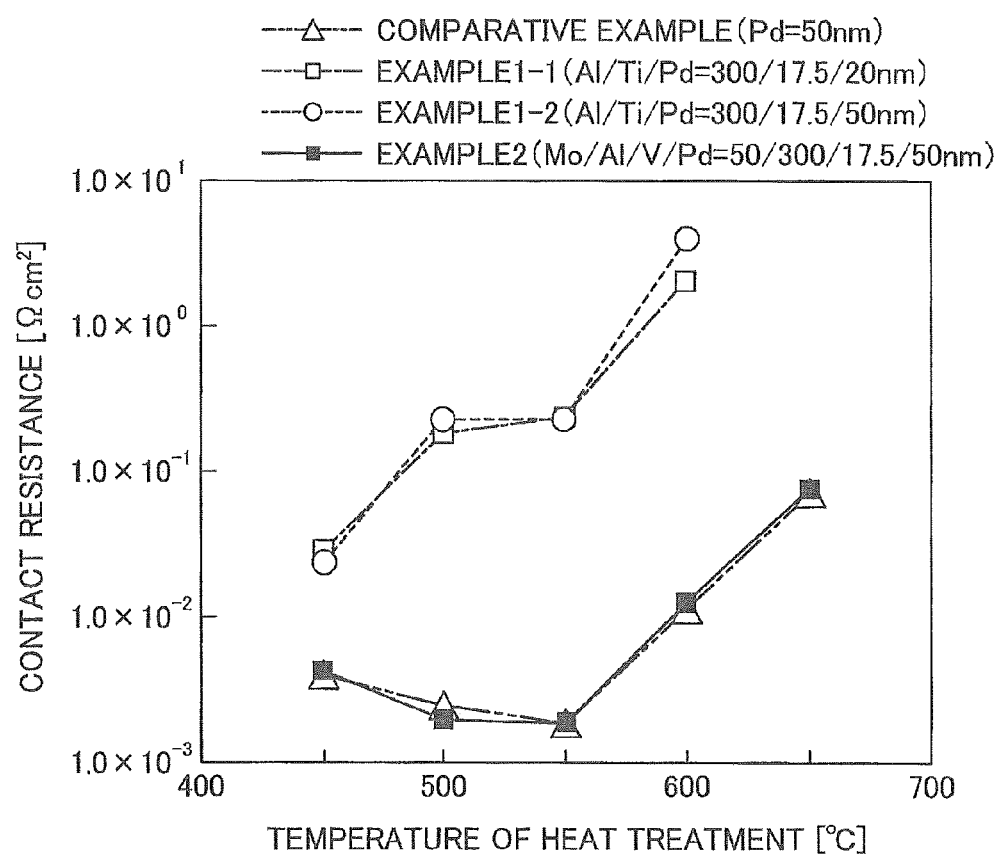
FIG. 12 is a diagram showing an example of the experimental result for evaluating performance of the semiconductor device according to the second embodiment and its modification.

FIGS. 12 to 14 are diagrams showing an example of experimental results for evaluation of the performance of the semiconductor devices according to the second embodiment (and its modification). The following describes the structures of the respective electrode layers in Examples and Comparative Example used for the experiments.

Example 1-1

* p electrode layer 630:
  p contact formation layer 631: (material) palladium (Pd), (layer thickness) 20 nm
  p barrier layer 632: not exist
* source electrode layer 640
  first n contact formation layer 641: (material) titanium (Ti), (layer thickness) 17.5 nm
  second n contact formation layer 642: (material) aluminum (Al), (layer thickness) 300 nm
  n cap layer 646: not exist Example 1-2

* p electrode layer 630:
  p contact formation layer 631: (material) palladium (Pd), (layer thickness) 50 nm
  p barrier layer 632: not exist

* source electrode layer 640
  first n contact formation layer 641: (material) titanium (Ti), (layer thickness) 17.5 nm
  second n contact formation layer 642: (material) aluminum (Al), (layer thickness) 300 nm
  n cap layer 646: not exist Example 2

* p electrode layer 630:
  p contact formation layer 631: (material) palladium (Pd), (layer thickness) 50 nm
  p barrier layer 632: (material) vanadium (V), (layer thickness) 17.5 nm
* source electrode layer 640
  first n contact formation layer 641: (material) vanadium (V), (layer thickness) 17.5 nm
  second n contact formation layer 642: (material) aluminum (Al), (layer thickness) 300 nm
  n cap layer 646: (material) molybdenum (Mo), (layer thickness) 50 nm
In this Example, a single vanadium layer serves as both the p barrier layer 632 and the first n contact formation layer 641.

Example 3

* p electrode layer 630:
  p contact formation layer 631: (material) palladium (Pd), (layer thickness) 50 nm
  p barrier layer 632: (material) molybdenum (Mo), (layer thickness) 50 nm
* source electrode layer 640
  first n contact formation layer 641: (material) titanium (Ti), (layer thickness) 17.5 nm
  second n contact formation layer 642: (material) aluminum (Al), (layer thickness) 300 nm
  n cap layer 646: (material) molybdenum (Mo), (layer thickness) 50 nm Comparative Example

* p electrode layer 630:
  p contact formation layer 631: (material) palladium (Pd), (layer thickness) 50 nm
  p barrier layer 632: not exist
* This Comparative Example includes the p electrode layer 630 alone (in other words, the source electrode layer 640 is not formed on the p electrode layer 630).

FIG. 12 shows the measured values of the contact resistance between the p electrode layer 630 and the p-type layer 530 when heat treatment was performed under nitrogen atmosphere for 5 minutes at each temperature with respect to Examples 1-1, 1-2 and 2 and Comparative Example. In the respective Examples, when the temperature of heat treatment was not higher than 400 degrees centigrade, the contact resistance was as sufficiently low as about $1.0 \times 10^{-2}$ ($\Omega cm^2$) or lower (not shown). This indicates the good ohmic contact between the p electrode layer 630 and the p-type layer 530. In Example 2, as in the case of Comparative Example, when the temperature of heat treatment was not higher than 650 degrees centigrade, the contact resistance was as low as about $1.0 \times 10^{-1}$ ($\Omega cm^2$) or lower. This indicates the good ohmic contact between the p electrode layer 630 and the p-type layer 530. In Example 2, as in the case of Comparative Example, when the temperature of heat treatment was not lower than 450 degrees centigrade and not higher than 550 degrees centigrade, the contact resistance was as very low as about $1.0 \times 10^{-2}$ ($\Omega cm^2$) or lower. This indicates the better ohmic contact between the p electrode layer 630 and the p-type layer 530. In Example 1, when the temperature of heat treatment was not higher than 450 degrees centigrade, the contact resistance was as low as about $1.0 \times 10^{-1}$ ($\Omega cm^2$) or lower. This indicates the good ohmic contact between the p electrode layer 630 and the p-type layer 530. When the temperature of heat treatment was not lower than 500 degrees centigrade, however, the contact resistance was as high as about $1.0 \times 10^{-1}$ ($\Omega cm^2$) or higher. This indicates degradation of the ohmic contact between the p electrode layer 630 and the p-type layer 530. These experimental results show that the temperature of heat treatment is preferably not higher than 650 degrees centigrade and is more preferably not lower than 450 degrees centigrade and not higher than 550 degrees centigrade.

FIG. 13 shows the measured values of the contact resistance between the p electrode layer 630 and the p-type layer 530 when heat treatment was performed under nitrogen atmosphere for various duration times at 550 degrees centigrade with respect to Example 2 and Comparative Example. In Example 2, as in the case of Comparative Example, when the duration time of heat treatment was not less than 1 minute, the contact resistance was as sufficiently low as about $1.0 \times 10^{-2}$ ($\Omega cm^2$) or lower. This indicates the good ohmic contact between the p electrode layer 630 and the p-type layer 530. In Example 2, as in the case of Comparative Example, when the duration time of heat treatment was not less than 2 minutes, the contact resistance was as further lower as about $1.0 \times 10^{-3}$ ($\Omega cm^2$) or lower. This indicates the better ohmic contact between the p electrode layer 630 and the p-type layer 530. The maximum duration time in the experiments was 10 minutes. In terms of inhibiting the reaction between electrodes and shortening the time required for production of semiconductor devices, the duration time of heat treatment is preferably not greater than 1 hour and is more preferably not greater than 10 minutes. These experimental results show that the duration time of heat treatment is preferably not less than 1 minute and not greater than 1 hour and is more preferably not less than 2 minutes and not greater than 10 minutes.

FIG. 14 shows the measured values of the contact resistance between the p electrode layer 630 and the p-type layer 530 when etching processes were performed after heat treatment with respect to Examples 2 and 3 and Comparative Example, for the purpose of evaluation of the etch resistance of the electrode. The etching processes performed were BHF process and ICP process. The process time was set to 1 minute, which is expected to be sufficient for formation of a contact hole for wiring. Both after the BHF process and after the ICP process, no substantial increase in contact resistance was observed in all Examples 2 and 3 and Comparative Example. This indicates the good ohmic contact maintained between the p electrode layer 630 and the p-type layer 530.

The above evaluation of the performance may be similarly performed for examples using other materials described above in place of the materials of the respective electrodes in the above examples subject to the performance evaluation, and similar results may be estimated.

C. Other Modifications

The invention is not limited to the embodiments or their modifications described above but may be implemented by any of various other embodiments without departing from the spirit and scope of the invention. Some examples of possible modifications are described below.

C1. Another Modification 1

The above embodiments respectively describe the trench MOSFET among the semiconductor devices, but the invention is applicable to other different types of semiconductor devices. For example, the invention is applicable to a lateral MOSFET, an insulated gate bipolar transistor (IGBT) and a bipolar transistor (including a base electrode layer serving as a control electrode layer). Furthermore, the invention is applicable to semiconductor devices in general where a first electrode layer formed on an n-type semiconductor layer and a second electrode layer formed on a p-type semiconductor layer operate at the same potential.

C2. Another Modification 2

The manufacturing processes described in the above respective embodiments are only illustrative and may be modified in various ways. For example, in the respective embodiments described above, the manufacturing process forms the p electrode layer 630 and the source electrode layer 640 and then performs heat treatment for both the p electrode layer 630 and the source electrode layer 640 (step S260 in FIG. 2, 4 or 9). A modification of the manufacturing process may separately perform heat treatment for the p electrode layer 630 after formation of the p electrode layer 630 and heat treatment for the source electrode layer 640 after formation of the source electrode layer 640. This modified procedure enables optimization of the heat treatment conditions for each of the p electrode layer 630 and the source electrode layer 640.

In the above respective embodiments, the p electrode layer 630 and the source electrode layer 640 are formed by electrode material deposition on a resist pattern by photolithography and subsequent lift-off process. A modified process may, however, form the p electrode layer 630 and the source electrode layer 640 by another technique, for example, a processing method using a resist pattern by photolithography as a mask.

The above respective embodiments employ aluminum as the material for the gate electrode layer 650 that serves as the control electrode layer. Alternatively, another material such as polysilicon may be employed for the gate electrode layer 650. The gate electrode layer 650 may be formed in a multi-layered structure. For example, the gate electrode layer 650 may be formed in a two-layered structure, such as Au/Ni structure, Al/Ti structure, Al/TiN structure (wherein Ni, Ti and TiN are respectively on the gate insulator film side) or may be formed in a three-layered structure, such as TiN/Al/TiN structure.

In the second embodiment described above, the p barrier layer 632 and the first n contact formation layer 641 may be formed by a single process. This enables the first n contact formation layer 641 to simultaneously serve as the p barrier layer 632, thus simplifying the process and reducing the material cost. For example, as the configuration of the p electrode layer 630 and the source electrode layer 640, the p contact formation layer 631 may be made of palladium (Pd), and a layer made of vanadium (V) may serve as both the p barrier layer 632 and the first n contact formation layer 641. The second n contact formation layer 642 may be made of aluminum (Al), and the n cap layer 646 may be made of molybdenum (Mo).

In the first embodiment described above, the n barrier layer 643 and the p contact formation layer 631 may be formed by a single process. This enables the p contact formation layer 631 to simultaneously serve as the n barrier layer 643, thus simplifying the process and reducing the material cost. For example, as the configuration of the p electrode layer 630 and the source electrode layer 640, the first n contact formation layer 641 may be made of titanium (Ti), and the second n contact formation layer 642 may be made of aluminum (Al). A layer made of palladium (Pd) may serve as both the n barrier layer 643 and the p contact formation layer 631 (p electrode layer 630).

C3. Another Modification 3

In the above respective embodiments, the gate insulator film 740 is made of silicon dioxide ($SiO_2$). The gate insulator film 740 may, however, be made of another material, such as aluminum oxide ($Al_2O_3$), silicon nitride (SiN), hafnium oxide ($HfO_2$) or zirconium oxide ($ZrO_2$). Moreover, the gate insulator film 740 may be formed in a multi-layered structure. For example, the gate insulator film 740 may be formed in a two-layered structure, such as $ZrO_2/SiO_2$ structure wherein $ZrO_2$ is provided on $SiO_2$, $HfO_2/SiO_2$ structure, $Al_2O_3/SiO_2$ structure or $SiO_2/SiN$ structure or may be formed in a three-layered structure, such as $ZrO_2/SiO_2/SiN$ structure wherein $SiO_2$ is provided on SiN and $ZrO_2$ is further provided on $SiO_2$ or $HfO_2/Al_2O_3/SiO_2$ structure.

The invention is not limited to the embodiments or the modifications described above but may be implemented by any of various other aspects or configurations without departing from the spirit and scope of the invention. For example, the technical features of each of the embodiments and the modifications corresponding to the technical features of each aspect described in SUMMARY OF THE INVENTION may be replaced or combined arbitrarily, in order to solve part or all of the problems described above or in order to achieve part of all of the advantageous effects described above. The technical features that are not described as essential in the specification hereof may be eliminated arbitrarily.

The invention claimed is:

1. A manufacturing method of a semiconductor device, the semiconductor device including: a p-type semiconductor layer mainly made of gallium nitride (GaN); an n-type semiconductor layer mainly made of gallium nitride (GaN) and connected with the p-type semiconductor layer; a first electrode layer formed on the n-type semiconductor layer; and a second electrode layer formed on the p-type semiconductor layer, wherein the first electrode layer and the second electrode layer are electrically connected such as to each operate at an identical potential, and wherein the first electrode layer is connected with at least a part of a surface of the second electrode layer which is opposite to a surface of the second electrode layer that is in contact with the p-type semiconductor layer, the manufacturing method comprising the steps of:
   forming the first electrode layer on the n-type semiconductor layer;
   forming the second electrode layer on the p-type semiconductor layer; and
   performing heat treatment for the first electrode layer and the second electrode layer formed on the semiconductor layers, wherein
   temperature of the heat treatment is not lower than 400 degrees centigrade and not higher than 650 degrees centigrade.

2. A manufacturing method of a semiconductor device, the semiconductor device including: a p-type semiconductor layer mainly made of gallium nitride (GaN); an n-type semiconductor layer mainly made of gallium nitride (GaN) and connected with the p-type semiconductor layer; a first electrode layer formed on the n-type semiconductor layer; and a second electrode layer formed on the p-type semiconductor layer, wherein the first electrode layer and the second electrode layer are electrically connected such as to each operate at an identical potential, and wherein the second electrode layer is connected with at least a part of a surface of the first electrode layer which is opposite to a surface of the first electrode layer that is in contact with the n-type semiconductor layer, the manufacturing method comprising the steps of:

forming the first electrode layer on the n-type semiconductor layer;

forming the second electrode layer on the p-type semiconductor layer; and performing heat treatment for the first electrode layer and the second electrode layer formed on the semiconductor layers.

3. The manufacturing method of the semiconductor device according to claim 2, wherein
temperature of the heat treatment is not lower than 450 degrees centigrade and not higher than 700 degrees centigrade.

4. The manufacturing method of the semiconductor device according to claim 1, wherein
the step of performing the heat treatment performs the heat treatment simultaneously for the first electrode layer and the second electrode layer.

5. The manufacturing method of the semiconductor device according to claim 1, wherein
the step of performing the heat treatment comprises the steps of:
performing first heat treatment for the first electrode layer; and
performing second heat treatment for the second electrode layer.

6. The manufacturing method of the semiconductor device according to claim 1, wherein
duration time of the heat treatment is not less than 1 minute and not greater than 1 hour.

7. The manufacturing method of the semiconductor device according to claim 1, wherein
the second electrode layer formed on the p-type semiconductor layer includes a p contact formation layer arranged on a side to be connected with the p-type semiconductor layer, wherein
the p contact formation layer contains at least one metal selected from the group consisting of nickel (Ni), palladium (Pd) and platinum (Pt) or an alloy of the selected metal.

8. The manufacturing method of the semiconductor device according to claim 7, wherein
the p contact formation layer has a layer thickness of not less than 3 nm and not greater than 1000 nm.

9. The manufacturing method of the semiconductor device according to claim 7, wherein
the second electrode layer formed on the p-type semiconductor layer includes a p barrier layer arranged on a side of the p contact formation layer that is opposite to a side of the p contact formation layer connected with the p-type semiconductor layer, wherein
the p barrier layer contains at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal.

10. The manufacturing method of the semiconductor device according to claim 9, wherein
the p barrier layer has a layer thickness of not less than 3 nm and not greater than 1000 nm.

11. The manufacturing method of the semiconductor device according to claim 7, wherein
the first electrode layer formed on the n-type semiconductor layer includes a first n contact formation layer arranged on a side connected with the n-type semiconductor layer, and a second n contact formation layer arranged on a side of the first n contact formation layer that is opposite to the side of the first n contact formation layer connected with the n-type semiconductor layer, wherein
the first n contact layer contains at least one metal selected from the group consisting of hafnium (Hf), titanium (Ti) and vanadium (V) or an alloy of the selected metal.

12. The manufacturing method of the semiconductor device according to claim 11, wherein
the first n contact formation layer has a layer thickness of not less than 3 nm and not greater than 100 nm.

13. The manufacturing method of the semiconductor device according to claim 11, wherein
the second n contact formation layer contains aluminum (Al) or an aluminum (Al) alloy.

14. The manufacturing method of the semiconductor device according to claim 13, wherein
the second n contact formation layer has a layer thickness of not less than 100 nm and not greater than 100 μm.

15. The manufacturing method of the semiconductor device according to claim 13, wherein
the first electrode layer formed on the n-type semiconductor layer includes an n cap layer arranged on a side of the second n contact formation layer that is opposite to the side of the second n contact formation layer connected with the first n contact formation layer, wherein
the n cap layer contains at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal.

16. The manufacturing method of the semiconductor device according to claim 15, wherein
the n cap layer has a layer thickness of not less than 3 nm and not greater than 100 μm.

17. The manufacturing method of the semiconductor device according to claim 9, wherein
the first electrode layer formed on the n-type semiconductor layer includes a first n contact formation layer arranged on a side connected with the n-type semiconductor layer, wherein
the p barrier layer and the first n contact formation layer are formed by a single process.

18. The manufacturing method of the semiconductor device according to claim 2, wherein
the first electrode layer formed on the n-type semiconductor layer includes a first n contact formation layer arranged on a side connected with the n-type semiconductor layer, and a second n contact formation layer arranged on a side of the first n contact formation layer that is opposite to the side of the first n contact formation layer connected with the n-type semiconductor layer, wherein
the first n contact layer contains at least one metal selected from the group consisting of hafnium (Hf), titanium (Ti) and vanadium (V) or an alloy of the selected metal.

19. The manufacturing method of the semiconductor device according to claim 18, wherein
the first n contact formation layer has a layer thickness of not less than 3 nm and not greater than 100 nm.

20. The manufacturing method of the semiconductor device according to claim 18, wherein
the second n contact formation layer contains aluminum (Al) or an aluminum (Al) alloy.

21. The manufacturing method of the semiconductor device according to claim 20, wherein
the second n contact formation layer has a layer thickness of not less than 100 nm and not greater than 1000 nm.

22. The manufacturing method of the semiconductor device according to claim 20, wherein
the first electrode layer formed on the n-type semiconductor layer includes an n barrier layer arranged on a side of the second n contact formation layer that is opposite to the side of the second n contact formation layer connected with the first n contact formation layer, wherein
the n barrier layer contains at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal.

23. The manufacturing method of the semiconductor device according to claim 22, wherein
the n barrier layer has a layer thickness of not less than 3 nm and not greater than 1000 nm.

24. The manufacturing method of the semiconductor device according to claim 18, wherein
the second electrode layer formed on the p-type semiconductor layer includes a p contact formation layer arranged on a side to be connected with the p-type semiconductor layer, wherein
the p contact formation layer contains at least one metal selected from the group consisting of nickel (Ni), palladium (Pd) and platinum (Pt) or an alloy of the selected metal.

25. The semiconductor device according to claim 24, wherein
the p contact formation layer has a layer thickness of not less than 3 nm and not greater than 100 µm.

26. The semiconductor device according to claim 24, wherein
the second electrode layer formed on the p-type semiconductor layer includes a p cap layer arranged on a side of the p contact formation layer that is opposite to a side of the p contact formation layer connected with the p-type semiconductor layer, wherein
the p cap layer contains at least one metal selected from the group consisting of hafnium (Hf), vanadium (V), titanium (Ti), molybdenum (Mo), niobium (Nb), rhodium (Rh), silicon (Si), tantalum (Ta), tungsten (W), zirconium (Zr), iridium (Ir), osmium (Os), rhenium (Re), TiSi, TiN, TiW, TaSi and TaN or an alloy of the selected metal.

27. The semiconductor device according to claim 26, wherein
the p cap layer has a layer thickness of not less than 3 nm and not greater than 100 µm.

28. The manufacturing method of the semiconductor device according to claim 22, wherein
the second electrode layer formed on the p-type semiconductor layer includes a p contact formation layer arranged on a side to be connected with the p-type semiconductor layer, and
the n barrier layer and the p contact formation layer are formed by a single process.

* * * * *